US012568702B2

(12) United States Patent
Isogai et al.

(10) Patent No.: US 12,568,702 B2
(45) Date of Patent: Mar. 3, 2026

(54) LIGHT RECEPTION ELEMENT AND ELECTRONIC APPARATUS

(71) Applicant: SONY SEMICONDUCTOR SOLUTIONS CORPORATION, Kanagawa (JP)

(72) Inventors: Yuji Isogai, Kanagawa (JP); Ryota Watanabe, Kanagawa (JP); Takeshi Yamazaki, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1000 days.

(21) Appl. No.: 17/292,744

(22) PCT Filed: Nov. 12, 2019

(86) PCT No.: PCT/JP2019/044233
§ 371 (c)(1),
(2) Date: May 11, 2021

(87) PCT Pub. No.: WO2020/110695
PCT Pub. Date: Jun. 4, 2020

(65) Prior Publication Data
US 2021/0399032 A1    Dec. 23, 2021

(30) Foreign Application Priority Data

Nov. 26, 2018    (JP) ................................. 2018-219981

(51) Int. Cl.
*H10F 39/00*        (2025.01)
(52) U.S. Cl.
CPC ................................ *H10F 39/8037* (2025.01)
(58) Field of Classification Search
CPC ............. H01L 25/167; H01L 27/14643; H01L 27/3227; H01L 31/02024; H01L 31/0284;
(Continued)

(56) References Cited

U.S. PATENT DOCUMENTS

| 5,885,856 A | 3/1999 Gilbert et al. |
| 2002/0079556 A1 | 6/2002 Ishikura et al. |

(Continued)

FOREIGN PATENT DOCUMENTS

| CN | 104465684 A | 3/2015 |
| CN | 106997886 A | 8/2017 |

(Continued)

OTHER PUBLICATIONS

International Search Report prepared by the Japan Patent Office on Jan. 28, 2020, for International Application No. PCT/JP2019/044233.

*Primary Examiner* — Moin M Rahman
(74) *Attorney, Agent, or Firm* — Sheridan Ross PC

(57) ABSTRACT

A light reception element and an electronic apparatus in which leakage current can be reduced to decrease current consumption are provided. The light reception element includes a pixel array section. The pixels each include two taps that detect an electric charge obtained through photoelectric conversion by a photoelectric conversion section. A flat region in each pixel, except the two taps and a pixel transistor region, includes a tap peripheral region and a pixel transistor neighboring region. In the tap peripheral region, an embedded oxide film is formed on a surface opposite to a light incident surface of a substrate, and a first semiconductor region is formed on the light incident surface side of the embedded oxide film. In the pixel transistor neighboring region, a second semiconductor region is formed. The present technology is applicable to a light reception element that carries out ranging, for example.

17 Claims, 21 Drawing Sheets

(58) Field of Classification Search
CPC .............. H01L 31/1032; H01L 31/107; H01L 27/14649; H01L 27/14645; H01L 27/14621; H01L 27/14689; H01L 27/14636; H01L 27/1464; H01L 27/14685; H01L 27/146; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H01L 27/14612; H01L 27/14603; H01L 27/14623; H01L 27/14629; H01L 31/0232; H01L 31/101; H01L 31/103; H01L 31/1037; H01L 31/111; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H04N 25/74; H04N 25/75; G01S 7/4863; G01S 17/10; G01S 17/894; H10F 39/18–1898; H10F 39/182–1825; H10F 39/184–1847; H10F 39/186–1865; H10F 39/189–1898; H10F 30/288; H10F 30/289; H10F 77/12–1285; H10F 71/00–1395; H10F 77/933; H10F 77/957–959; H10F 77/50; H10F 77/496; H10F 77/413; H10F 77/407; H10F 77/703; H10F 77/707; H10F 39/8037; H10F 39/199; H10F 30/21; H10F 30/221; H10F 30/2218; H10F 30/26; H10F 39/802; H10F 39/8057; H10F 39/8067; H10F 77/40; H10K 30/88; H10K 30/87
See application file for complete search history.

(56) References Cited

U.S. PATENT DOCUMENTS

| | | | | |
|---|---|---|---|---|
| 2007/0069326 | A1 | 3/2007 | Yoshizumi et al. | |
| 2008/0265296 | A1 | 10/2008 | Uya | |
| 2010/0085455 | A1 | 4/2010 | Goto | |
| 2011/0089526 | A1 | 4/2011 | Lee et al. | |
| 2012/0086093 | A1* | 4/2012 | Otsuka | H04N 23/10 |
| | | | | 257/E31.127 |
| 2012/0217605 | A1 | 8/2012 | Kunikiyo | |
| 2013/0015513 | A1* | 1/2013 | Kido | H10F 39/807 |
| | | | | 257/292 |
| 2015/0028404 | A1 | 1/2015 | Kunikiyo | |
| 2017/0194367 | A1 | 7/2017 | Fotopoulou et al. | |
| 2017/0213862 | A1 | 7/2017 | Kamino | |
| 2017/0301708 | A1 | 10/2017 | Fotopoulou et al. | |
| 2018/0076259 | A1 | 3/2018 | Park | |
| 2018/0240826 | A1 | 8/2018 | Park | |
| 2018/0240840 | A1* | 8/2018 | Yamashita | H04N 25/76 |
| 2019/0342510 | A1 | 11/2019 | Sano | |

FOREIGN PATENT DOCUMENTS

| | | | |
|---|---|---|---|
| JP | H10-092921 | 4/1998 | |
| JP | 2002-190516 | 7/2002 | |
| JP | 2007-081206 | 3/2007 | |
| JP | 2010-087369 | 4/2010 | |
| JP | 2011-086904 | 4/2011 | |
| JP | 2012-178429 | 9/2012 | |
| JP | 2016-181717 | 10/2016 | |
| JP | 2017-522727 | 8/2017 | |
| JP | 2018-117117 | 7/2018 | |
| TW | 201733104 A | 9/2017 | |
| TW | 201735406 A | 10/2017 | |
| WO | WO-2018135320 A1 * | 7/2018 | ............... G01C 3/06 |

* cited by examiner

F I G . 1

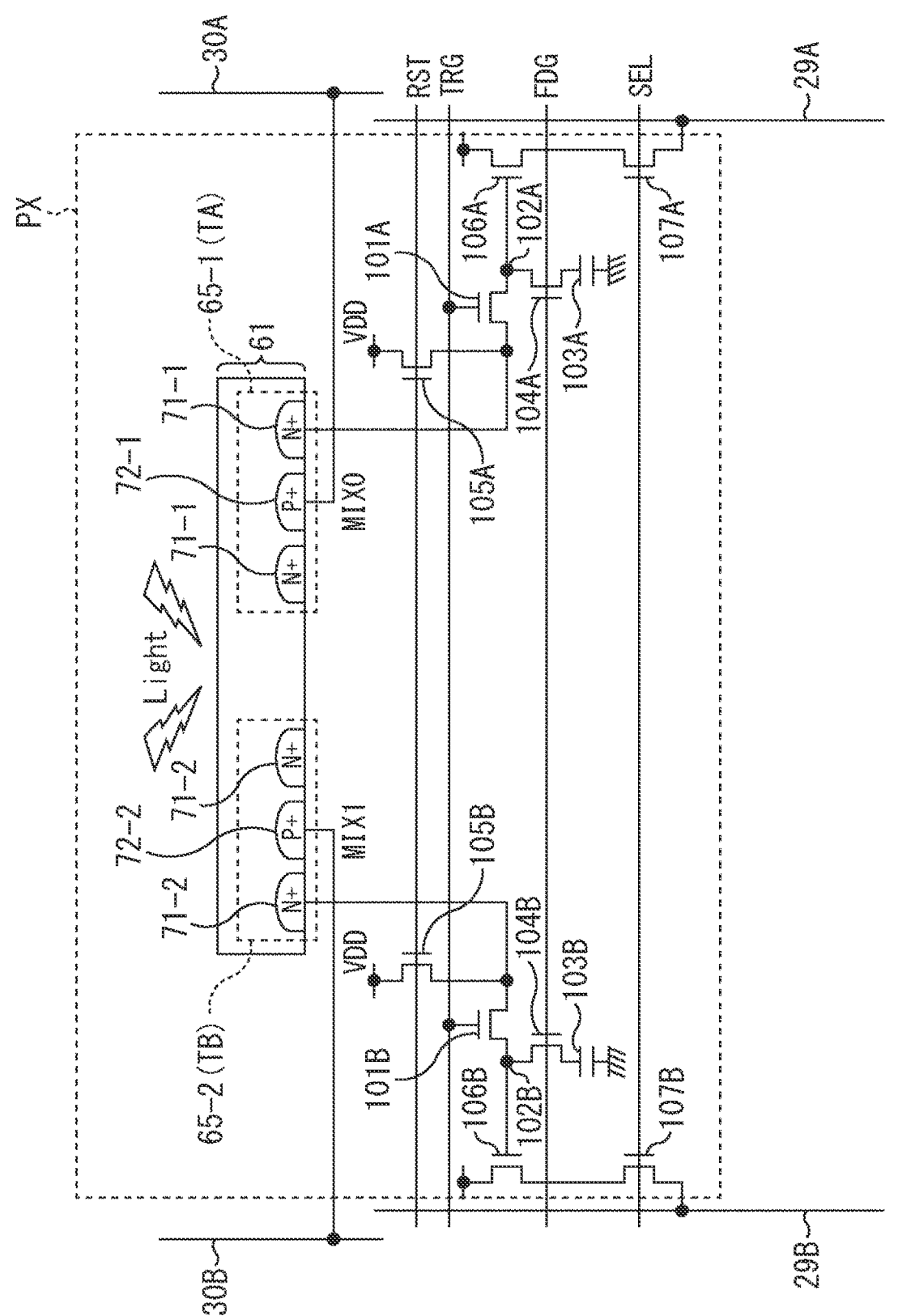
F I G . 4

F I G . 6
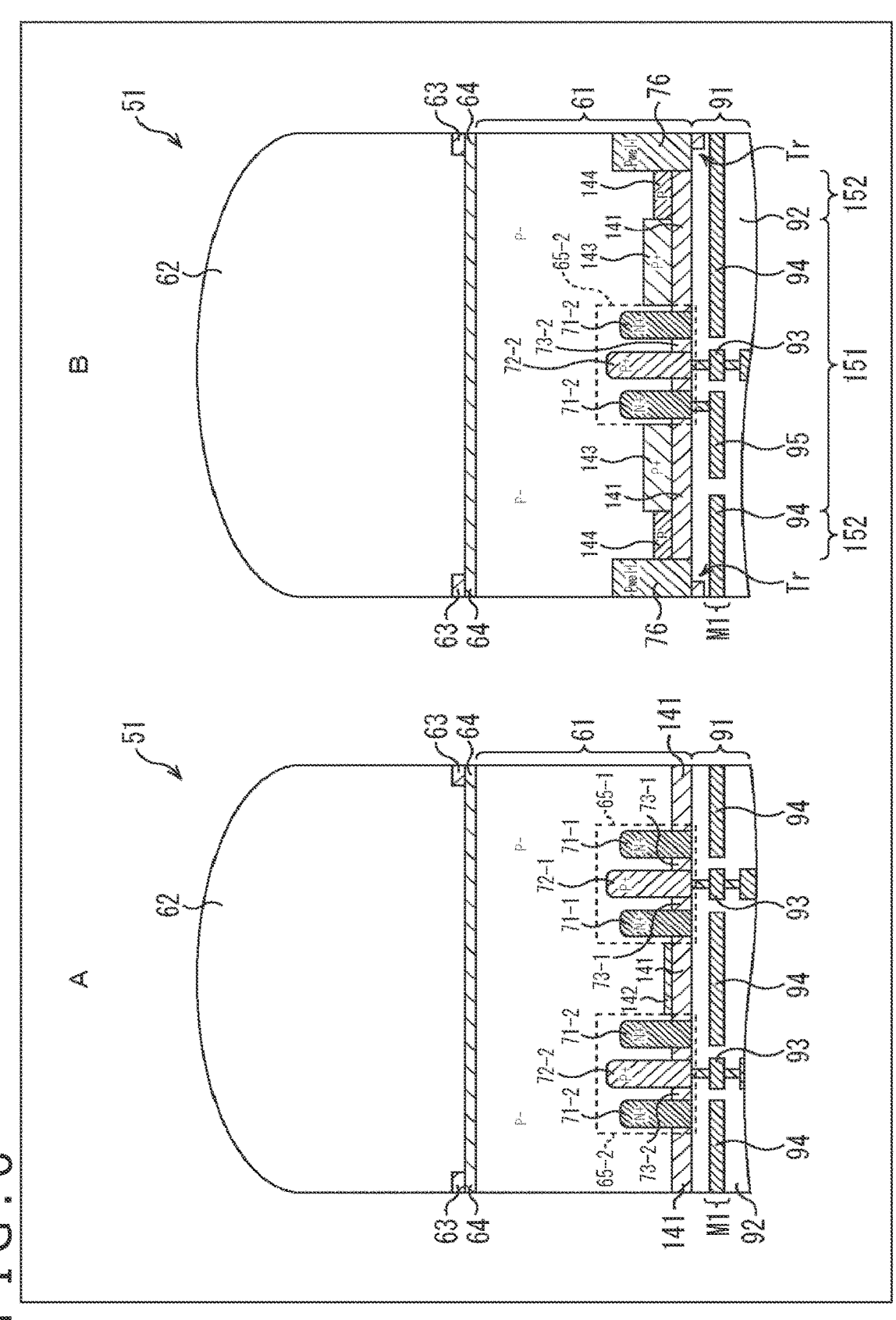

F I G . 1 1
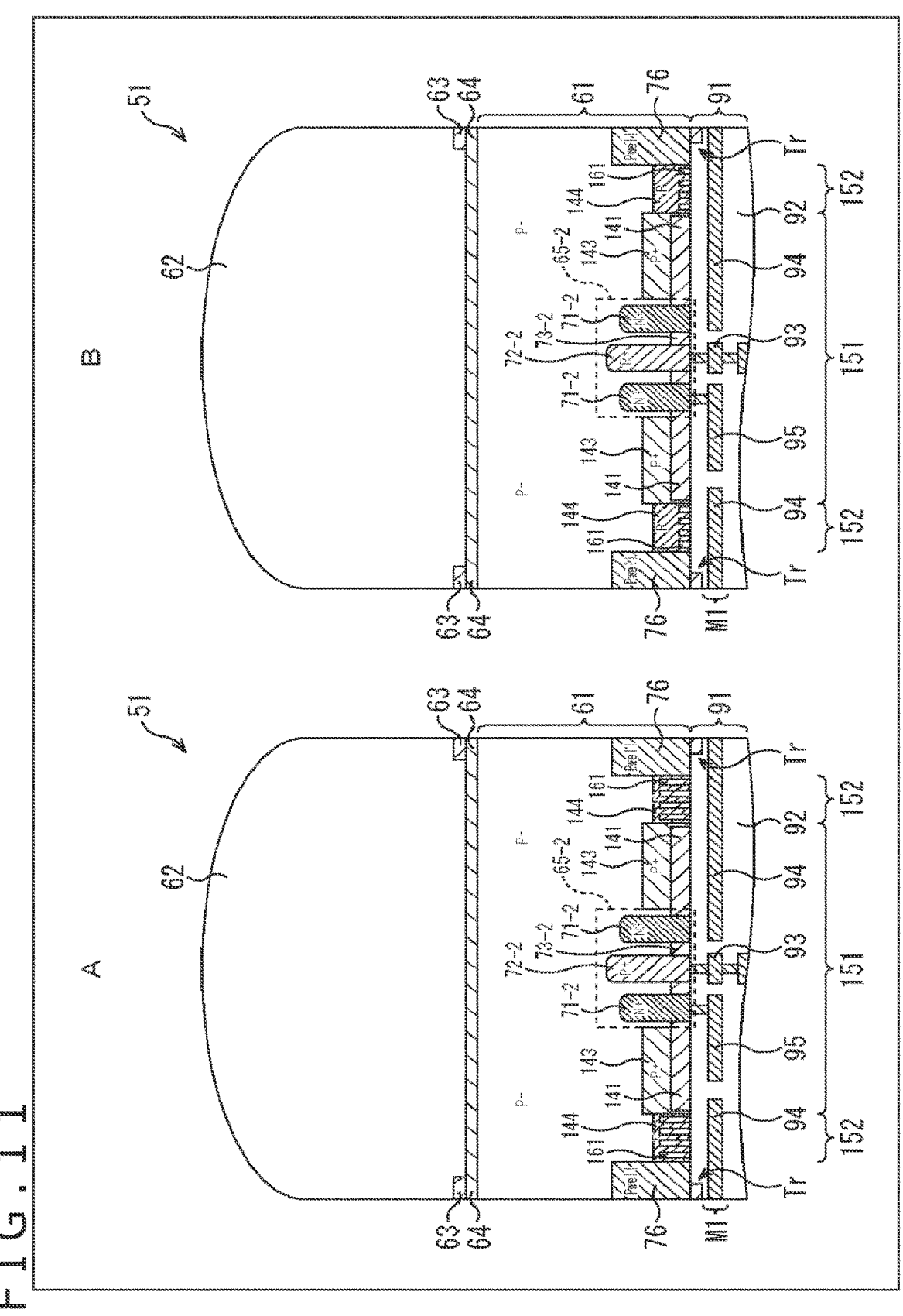

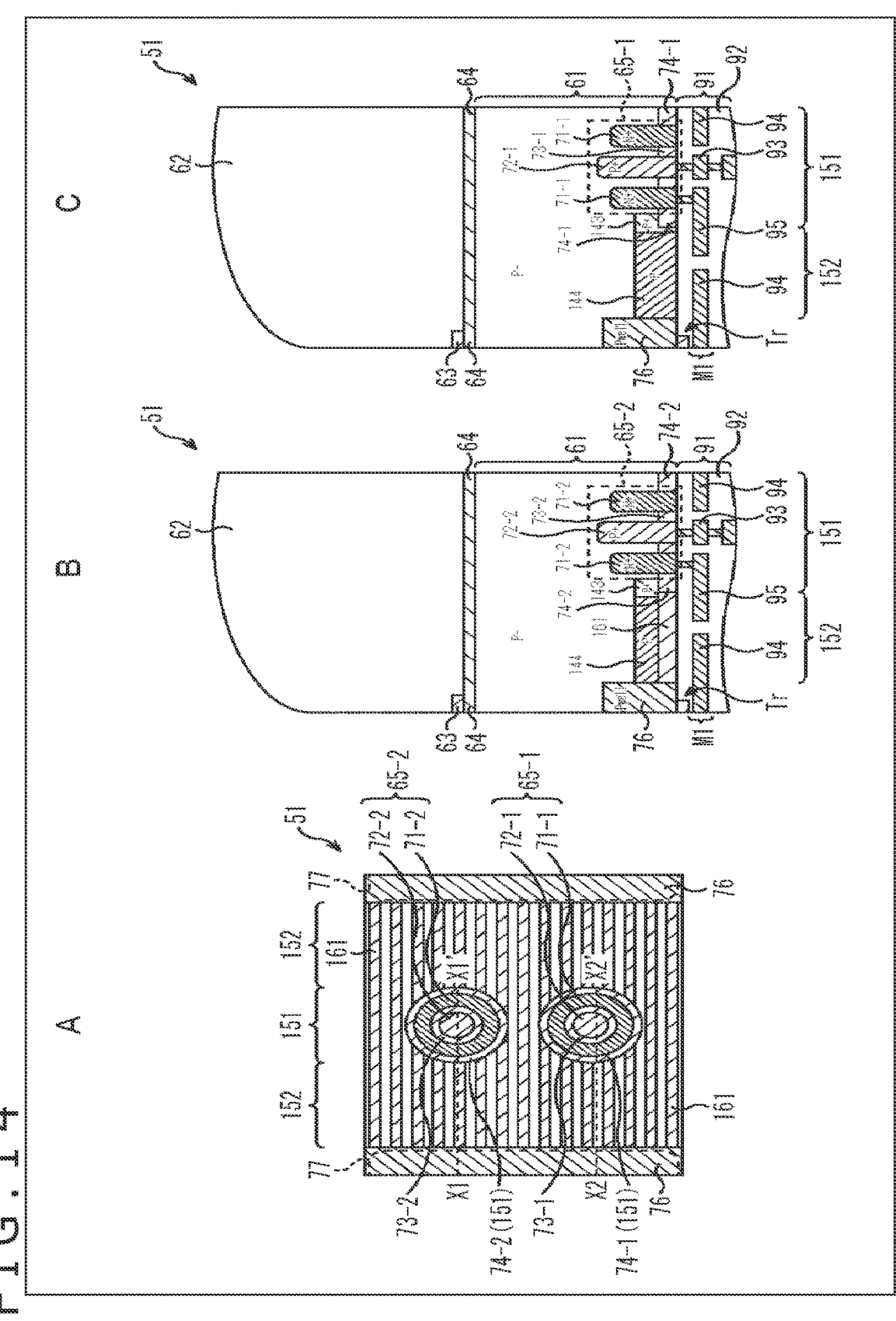
F I G . 1 4

F I G . 1 5
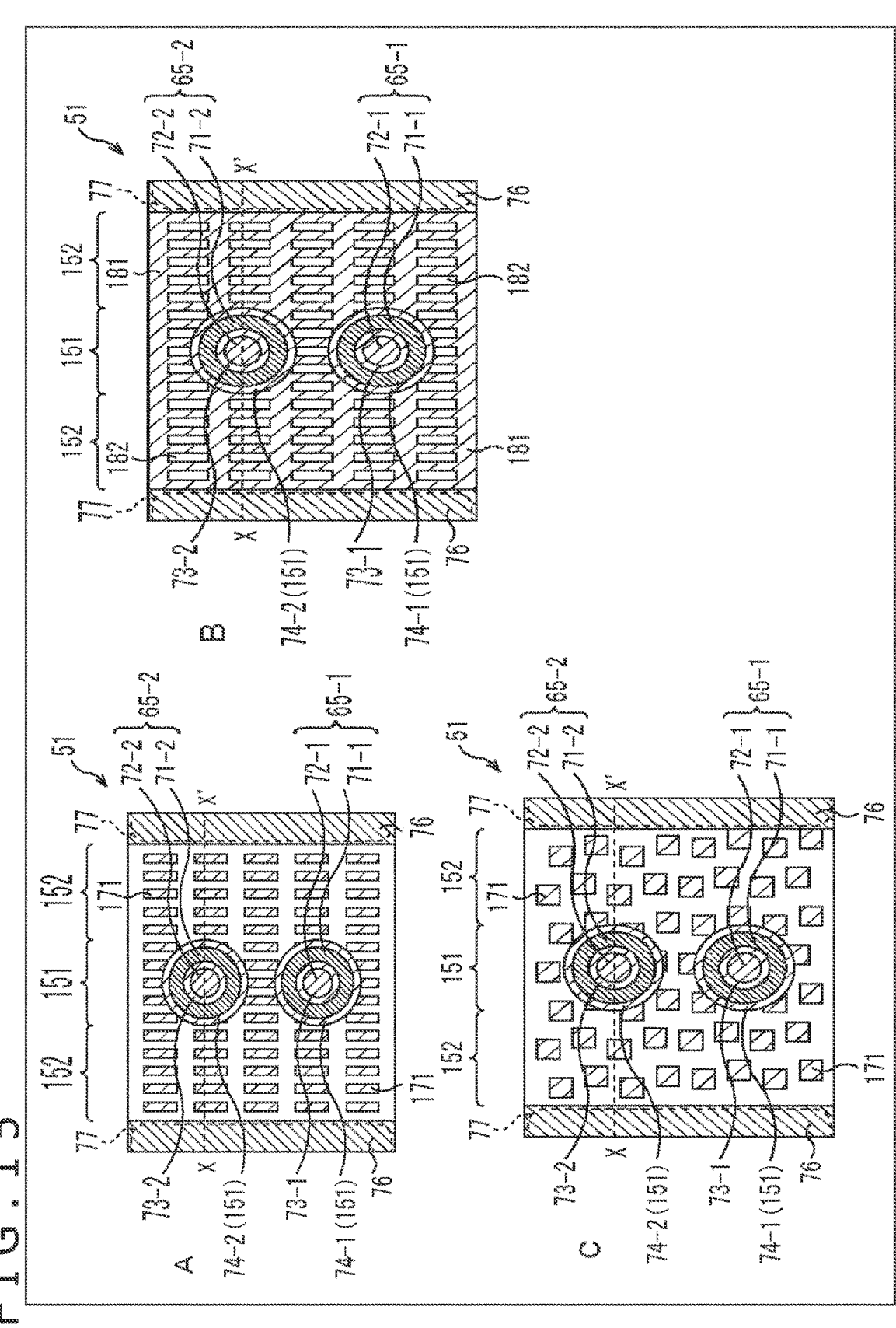

F I G . 2 0
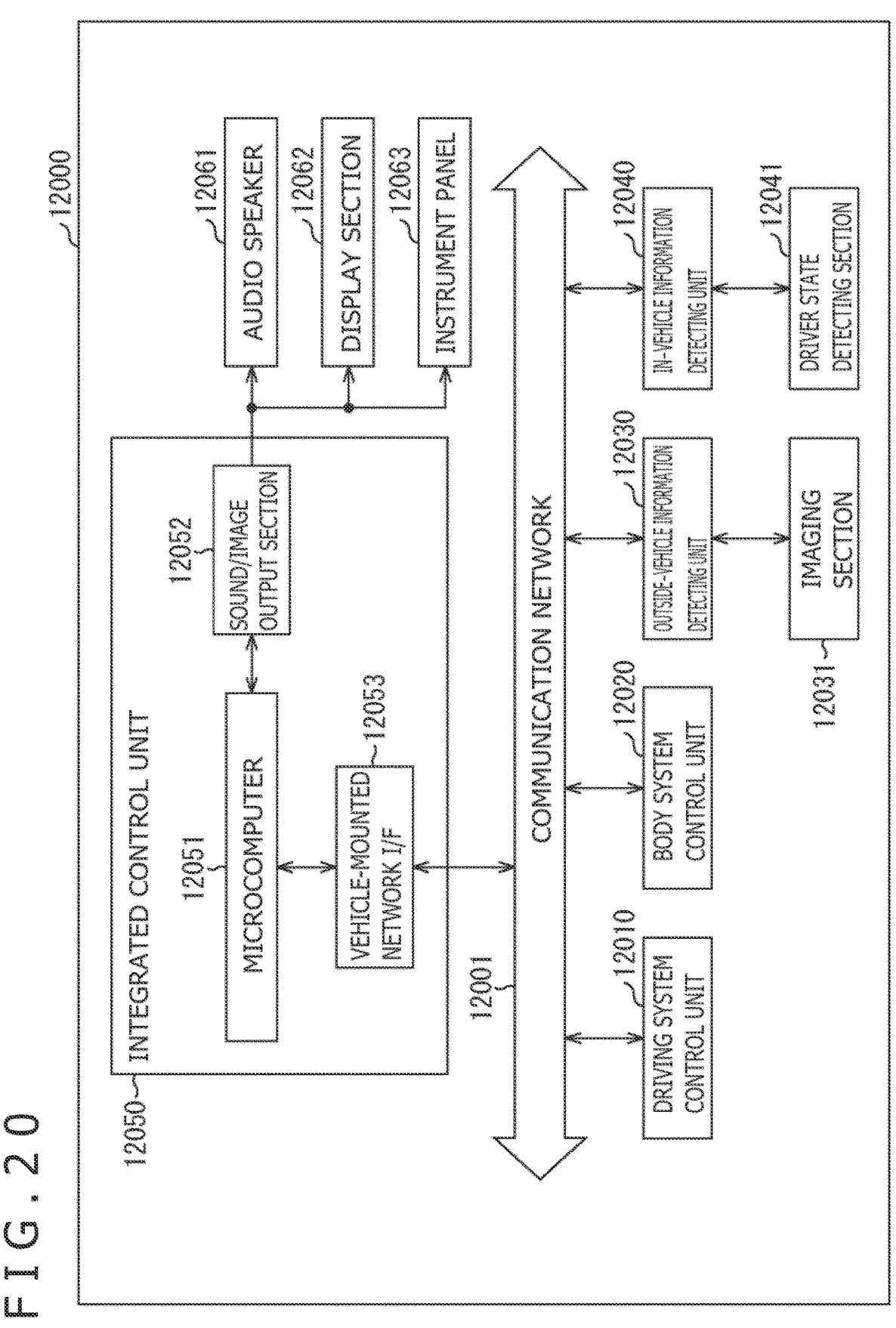

F I G . 2 1
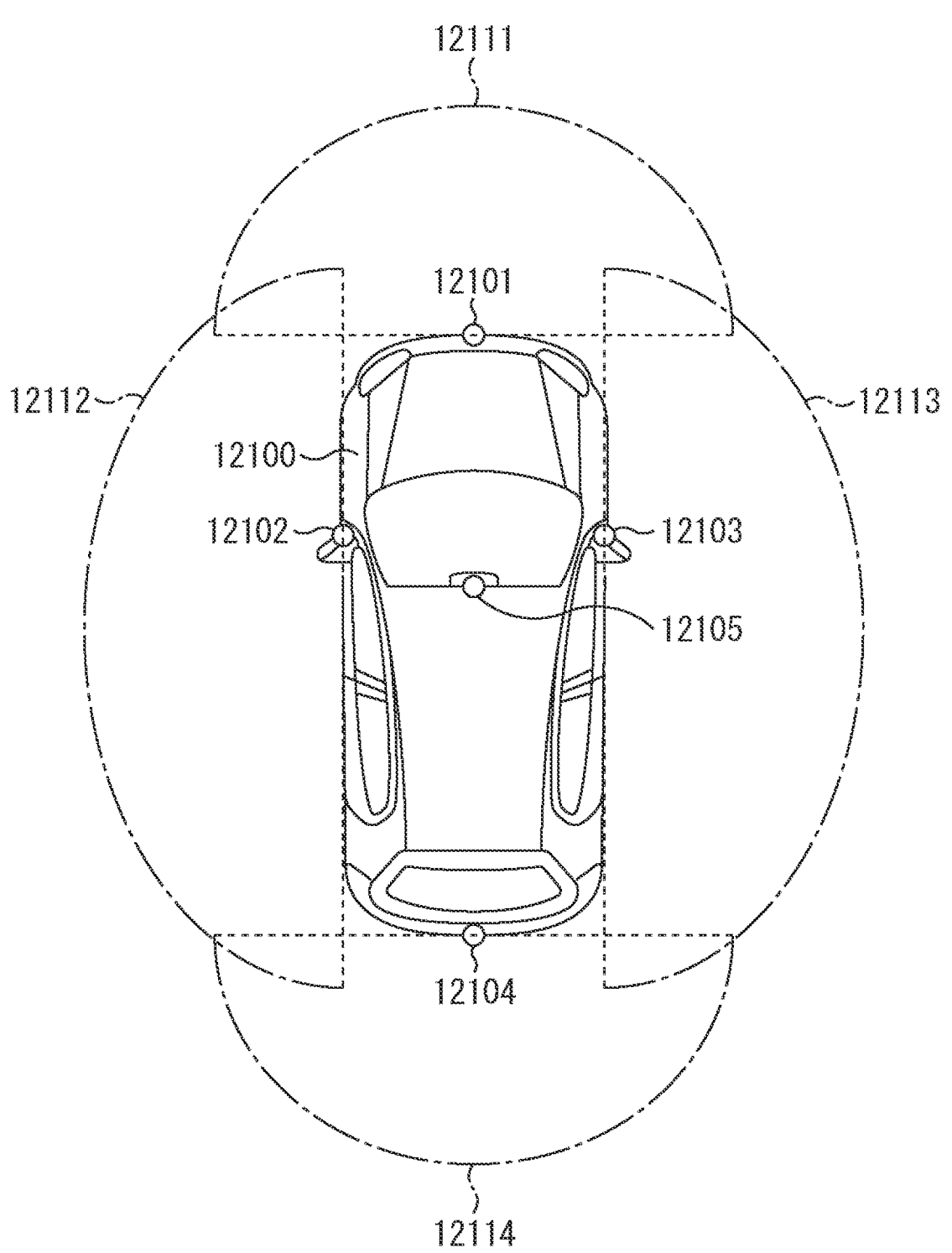

LIGHT RECEPTION ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2019/044233 having an international filing date of 12 Nov. 2019, which designated the United States, which PCT application claimed the benefit of Japanese Patent Application No. 2018-219981, filed 26 Nov. 2018, the entire disclosures of each of which are incorporated herein by reference.

TECHNICAL FIELD

The present technology relates to a light reception element and an electronic apparatus, and particularly, relates to a light reception element and an electronic apparatus by which leakage current can be reduced to decrease current consumption.

BACKGROUND ART

Ranging systems using indirect ToF (Time of Flight) have been known. Such a ranging system needs to include a sensor that is capable of, when active light of a certain phase is emitted by means of an LED (Light Emitting Diode) or a laser and the active light strikes on an object to generate reflection light, allocating signal electric charges generated when the reflection light is received, to different regions.

As such, for example, a technology of generating current in a substrate of a sensor by directly applying voltage to the substrate, so that a wide range region of the substrate can be modulated, has been proposed (for example, see PTL 1). A sensor of this type is also called a CAPD (Current Assisted Photonic Demodulator) sensor.

A CAPD sensor is provided with at least two taps each including an application electrode to which voltage is applied and an attraction electrode for collecting electric charges. When positive voltage is applied to the application electrode of one of the two taps, an electric field is generated between the two taps, so that a current flow is caused. Then, signal electric charges generated by photoelectric conversion are introduced to and collected by the attraction electrode of the other tap.

CITATION LIST

Patent Literature

[PTL 1]
  Japanese Patent Laid-Open No. 2011-86904

SUMMARY

Technical Problem

CAPD sensors have been required to reduce leakage current such that current consumption is decreased.

The present technology has been achieved in view of the abovementioned circumstances, and is to reduce leakage current such that current consumption can be decreased.

Solution to Problem

A light reception element according to a first aspect of the present technology includes a pixel array section having pixels two-dimensionally arranged in a matrix form, the pixels each including two taps: a first tap that detects an electric charge obtained through photoelectric conversion by a photoelectric conversion section; and a second tap that detects an electric charge obtained through photoelectric conversion by the photoelectric conversion section. In the light reception element, a flat region in each pixel, except the two taps and a pixel transistor region, includes a tap peripheral region that is an outer peripheral portion of the taps and a pixel transistor neighboring region that is near the pixel transistor region, in the tap peripheral region, an embedded oxide film is formed on a surface opposite to a light incident surface of a substrate, and a first semiconductor region having the same conductive type as the substrate and having an impurity concentration higher than a substrate concentration is formed on the light incident surface side of the embedded oxide film, and in the pixel transistor neighboring region, a second semiconductor region having the same conductive type as the substrate and having an impurity concentration higher than the substrate concentration is formed.

An electronic apparatus according to a second aspect of the present technology is provided with a light reception element including a pixel array section having pixels two-dimensionally arranged in a matrix form, the pixels each including two taps: a first tap that detects an electric charge obtained through photoelectric conversion by a photoelectric conversion section; and a second tap that detects an electric charge obtained through photoelectric conversion by the photoelectric conversion section. In the light reception element, a flat region in each pixel, except the two taps and a pixel transistor region, includes a tap peripheral region that is an outer peripheral portion of the taps and a pixel transistor neighboring region that is near the pixel transistor region, in the tap peripheral region, an embedded oxide film is formed on a surface opposite to a light incident surface of a substrate, and a first semiconductor region having the same conductive type as the substrate and having an impurity concentration higher than a substrate concentration is formed on the light incident surface side of the embedded oxide film, and in the pixel transistor neighboring region, a second semiconductor region having the same conductive type as the substrate and having an impurity concentration higher than the substrate concentration is formed.

In the first and second aspects of the present technology, the pixel array section having pixels two-dimensionally arranged in a matrix form is provided, and the pixels each include two taps: the first tap that detects an electric charge obtained through photoelectric conversion by the photoelectric conversion section; and the second tap that detects an electric charge obtained through photoelectric conversion by the photoelectric conversion section. A flat region in each pixel, except the two taps and the pixel transistor region, includes the tap peripheral region that is an outer peripheral portion of the taps and the pixel transistor neighboring region that is near the pixel transistor region. In the tap peripheral region, an embedded oxide film is formed on the surface opposite to the light incident surface of the substrate, and the first semiconductor region having the same conductive type and having an impurity concentration higher than the substrate concentration is formed on the light incident surface side of the embedded oxide film. In the pixel transistor neighboring region, the second semiconductor region having the same conductive type as the substrate and having an impurity concentration higher than the substrate concentration is formed.

The light reception element or the electronic apparatus may be an independent element/apparatus, or may be a module that is incorporated in another apparatus.

BRIEF DESCRIPTION OF DRAWINGS

FIG. 1 is a block diagram depicting a configuration example of a light reception element to which the present technology is applied.

FIG. 4 is a diagram depicting an equivalent circuit of a pixel.

FIG. 6 depicts cross-sectional views of a first configuration example of a pixel in FIG. 1.

FIG. 11 depicts cross-sectional views of a modification of the second configuration example.

FIG. 14 depicts diagrams depicting a seventh configuration example of the pixel in FIG. 1.

FIG. 15 depicts diagrams depicting eighth to tenth configuration examples of the pixel in FIG. 1.

FIG. 20 is a block diagram depicting an example of schematic configuration of a vehicle control system.

FIG. 21 is a diagram of assistance in explaining an example of installation positions of an outside-vehicle information detecting section and an imaging section.

DESCRIPTION OF EMBODIMENTS

Figure 2:
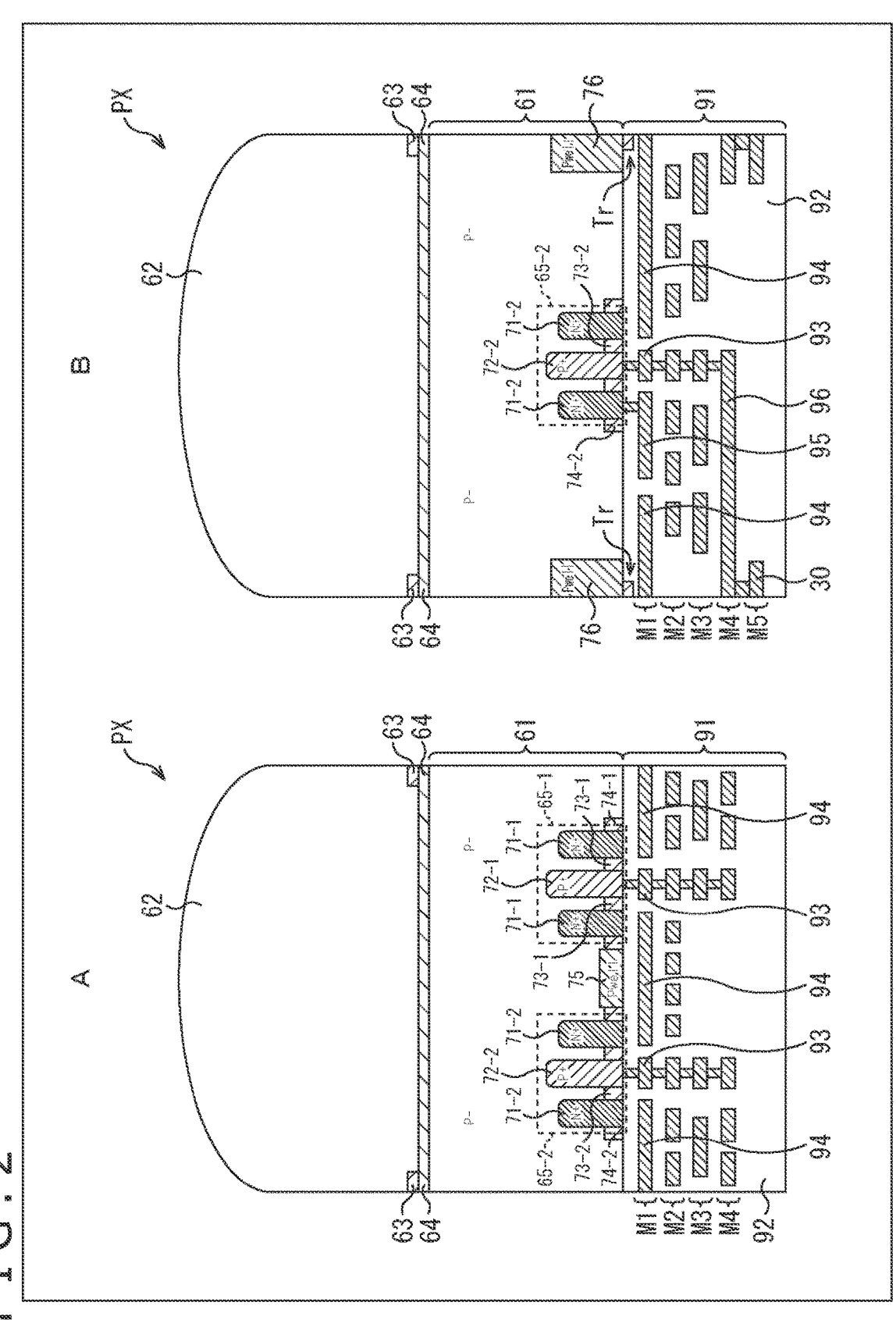
FIG. 2 depicts cross-sectional views of a pixel in a comparative example.

Hereinafter, an explanation will be given of modes for carrying out the present technology (hereinafter, referred to as embodiments). The explanation will be given in the following order.

1. Configuration Example of Light Reception Element
2. Comparative Structure Example of Pixel
3. Configuration Example of Equivalent Circuit of Pixel
4. First Configuration Example of Pixel
5. Second Configuration Example of Pixel
6. Third to Fifth Configuration Examples of Pixel
7. Sixth Configuration Example of Pixel 8. Seventh Configuration Example of Pixel
9. Eighth to Tenth Configuration Examples of Pixel
10. Other Modifications
11. Configuration Example of Ranging Module
12. Configuration Example of Electronic Apparatus
13. Examples of Application to Mobile Body <1. Configuration Example of Light Reception Element>

Figure 1:
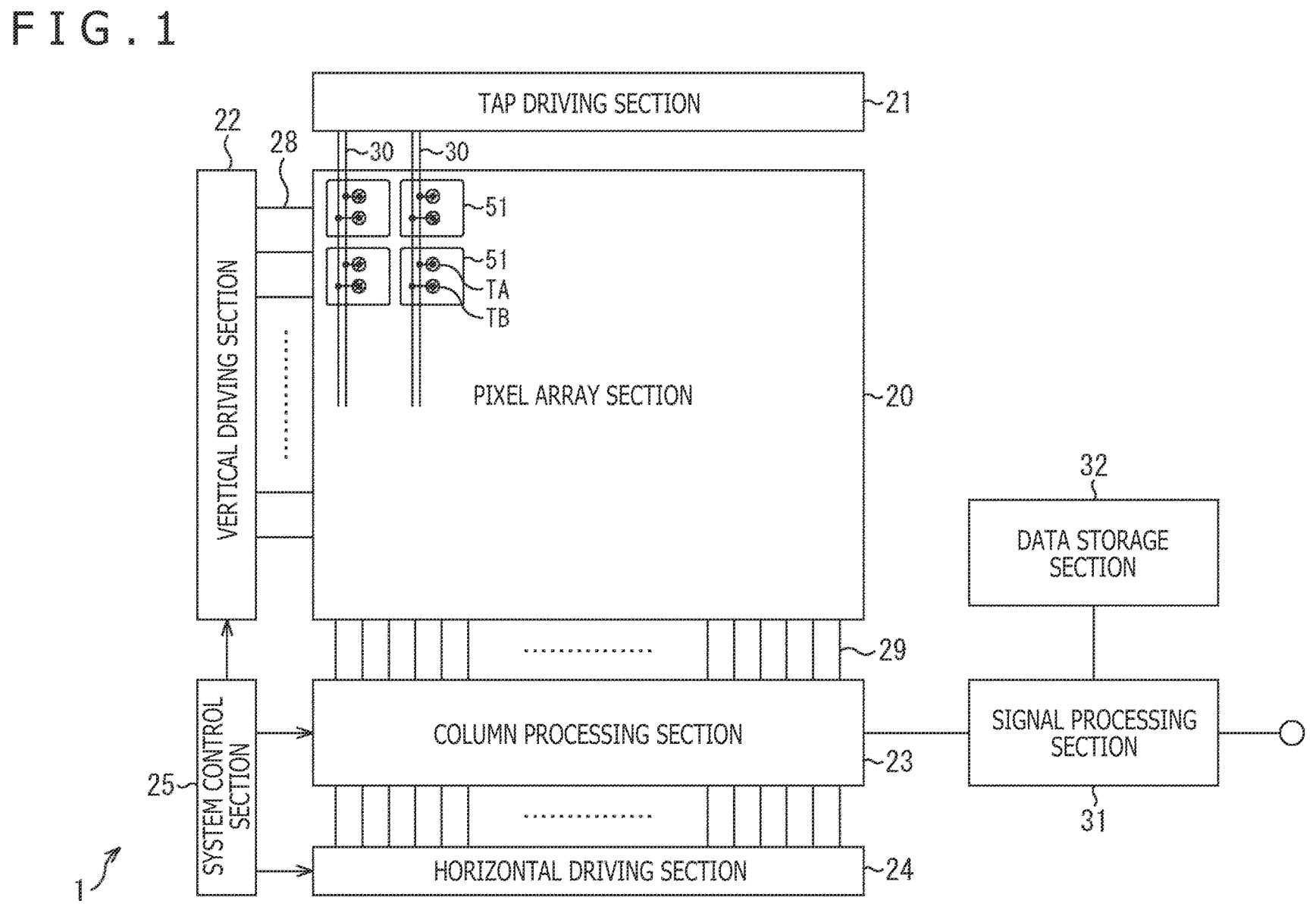

FIG. 1 is a block diagram depicting a configuration example of a light reception element to which the present technology is applied.

A light reception element 1 depicted in FIG. 1 receives reflection light of pulse light that has been emitted from a predetermined light source and reflected by a subject, and outputs indirect ToF ranging information. The light reception element 1 includes a pixel array section 20 formed on an unillustrated semiconductor substrate and peripheral circuit sections integrated on the same semiconductor substrate as the pixel array section 20. The peripheral circuit sections include a tap driving section 21, a vertical driving section 22, a column processing section 23, a horizontal driving section 24, and a system control section 25, for example.

The light reception element 1 further includes a signal processing section 31 and a data storage section 32. It is to be noted that the signal processing section 31 and the data storage section 32 may be mounted on the same substrate as the light reception element 1 or may be disposed on a substrate separate from that for the light reception element 1.

The pixel array section 20 has a configuration in which pixels 51 that generate electric charges depending on a light quantity of received light and that output signals depending on the electric charges are two-dimensionally arranged in a matrix form along a row direction and a column direction. That is, the pixel array section 20 includes a plurality of the pixels 51 that photoelectrically convert incident light and output signals depending on electric charges obtained as a result of the photoelectric conversion. Here, the row direction refers to a horizontal arrangement direction of the pixels 51. The column direction refers to the vertical arrangement direction of the pixels 51. The row direction is a lateral direction in FIG. 1. The column direction is a longitudinal direction in FIG. 1.

Each of the pixels 51 has a CAPD structure, receives incident light, or particularly, infrared light, from the outside, photoelectrically converts the light, and outputs a pixel signal depending on an electrical charge obtained as a result of the photoelectric conversion. The pixels 51 each include a first tap TA that detects an electric charge obtained through photoelectric conversion by application of a predetermined voltage MIX0 (FIG. 4) and a second tap TB that detects an electric charge obtained through photoelectric conversion by application of a predetermined voltage MIX1 (FIG. 4) .

The tap driving section 21 supplies the predetermined voltage MIX0 to the first tap TA of each pixel 51 in the pixel array section 20 via a predetermined voltage supply line 30 and supplies a predetermined voltage MIX1 to the second tap TB of each pixel 51 via a predetermined voltage supply line 30. Thus, the two voltage supply lines 30 for transmitting the voltage MIX0 and for transmitting the voltage MIX1 are arranged for each pixel column in the pixel array section 20.

In the matrix-shaped pixel arrangement in the pixel array section 20, a pixel driving line 28 for each pixel row is arranged in the row direction, and two vertical signal lines 29 for each pixel column are arranged in the column direction. For example, the pixel driving line 28 transmits a drive signal for driving to read out signals from the pixels 51. It is to be noted that FIG. 1 depicts one pixel driving line 28, but the number of the pixel driving lines 28 is not limited to one. One end of each pixel driving line 28 is connected to an output end of the corresponding row in the vertical driving section 22.

The vertical driving section 22 includes a shift register, an address decoder, or the like, and drives all the pixels 51 in the pixel array section 20 simultaneously, or drives the pixels 51 by row, for example. That is, the vertical driving section 22 and the system control section 25 that controls the vertical driving section 22 constitute a driving section that controls operation of each pixel in the pixel array section 20.

Signals outputted from the pixels 51 in a certain pixel row according to driving control performed by the vertical driving section 22 are inputted to the column processing section 23 through the vertical signal lines 29. The column processing section 23 performs a predetermined signal process on pixel signals outputted from the pixel 51 via the vertical signal lines 29, and temporarily holds the signal-processed pixel signals. For example, the column processing section 23 performs, as the signal processing, noise removal or AD (Analog to Digital) conversion, etc., and then, holds the AD-converted pixel signals.

The horizontal driving section 24 includes a shift register, an address decoder, or the like, and sequentially selects unit circuits corresponding to the respective pixel columns in the column processing section 23. As a result of this selective scanning by the horizontal driving section 24, pixel signals obtained through the signal process for each unit circuit by the column processing section 23 are sequentially outputted.

The system control section 25 includes, for example, a timing generator that generates various timing signals. On the basis of the various timing signals generated by the timing generator, driving control of the tap driving section 21, the vertical driving section 22, the column processing section 23, the horizontal driving section 24, etc., is performed.

The signal processing section 31 has at least a computation processing function, and performs various signal processes including a computation process, on the basis of the pixel signals outputted from the column processing section 23. To cause the signal processing section 31 to perform a signal process, the data storage section 32 temporarily stores data that is necessary for the process.

<2. Comparative Structure Example of Pixel>

The structure of each pixel 51 formed in the pixel array section 20 of the light reception element 1 in FIG. 1 will be given later in detail, and first, a pixel structure in a comparative example of the pixel 51 will be explained.

Figure 3:
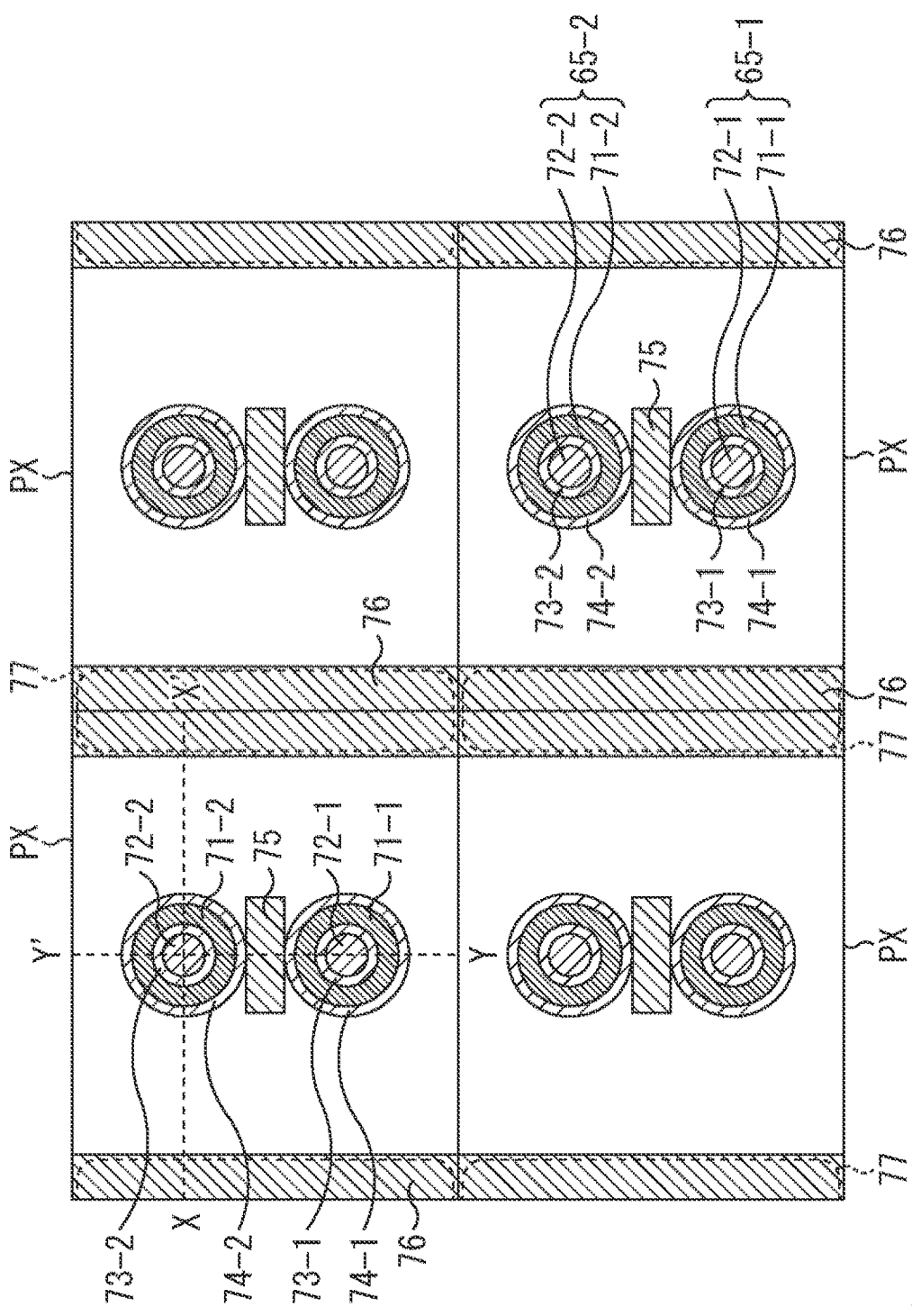
FIG. 3 is a plan view of pixels in the comparative example.

FIG. 2 is a cross-sectional view of a pixel PX which is a comparative example to be compared with the pixel 51. FIG. 3 is a plan view of the pixels PX which are arrayed by 2×2. In FIG. 2, A is a cross-sectional view taken along line Y-Y' in FIG. 3, and B is a cross-sectional view taken along line X-X' in FIG. 3.

As depicted in FIG. 2, the pixel PX includes a semiconductor substrate 61 that includes, for example, a silicon substrate, or specifically, a P-type semiconductor layer, and an on-chip lens 62 that is formed on the semiconductor substrate 61. The upper surface of the semiconductor substrate 61 on which the on-chip lens 62 is formed is a rear surface, and the lower surface of the semiconductor substrate 61 on which a multilayer wiring layer 91 is formed is a front surface.

The semiconductor substrate 61 is formed so as to have a longitudinal thickness, in FIG. 2, of 20 μm or less, for example. Specifically, the longitudinal thickness is a thickness in a direction perpendicular to the surfaces of the semiconductor substrate 61. It is to be noted that the semiconductor substrate 61 may have a thickness of 20 μm or larger. It is sufficient that the thickness is determined according to a desired characteristic of the light reception element 1 and the like.

In addition, the semiconductor substrate 61 is a high-resistance P-Epi substrate having a substrate concentration of 1E+13 order or lower, for example. The semiconductor substrate 61 is formed so as to have a resistivity of 500 [Ωcm] or higher, for example.

Here, the relation between the substrate concentration and the resistivity of the semiconductor substrate 61 is set in such a way that, for example, the resistivity is 2000 [Ωcm] when the substrate concentration is 6.48E+12 [cm$^3$], the resistivity is 1000 [Ωcm] when the substrate concentration is 1.30E+13 [cm$^3$], the resistivity is 500 [Ωcm] when the substrate concentration is 2.59E+13 [cm$^3$], and the resistivity is 100 [Ωcm] when the substrate concentration is 1.30E+14 [cm$^3$].

In FIG. 2, the upper surface of the semiconductor substrate 61 is a surface (hereinafter, also referred to as a light incident surface) on which reflection light is incident. The on-chip lens 62 that condenses reflection light incident from the outside and guides the light to be incident on the semiconductor substrate 61 is formed on the light incident surface.

Moreover, an inter-pixel light shielding film 63 for preventing crosstalk with an adjacent pixel is formed, on the light incident surface of the semiconductor substrate 61, at a boundary section of the pixel PX. The inter-pixel light shielding film 63 prevents light incident on the pixel PX from entering an adjacent other pixel PX.

A fixed charge film 64 that includes one film or layered films having a positive fixed charge is formed on the light incident surface-side interface of the semiconductor substrate 61. The fixed charge film 64 inhibits occurrence of dark current on the incident surface side of the semiconductor substrate 61.

A signal extraction section 65-1 and a signal extraction section 65-2 are formed on the side of the surface of the semiconductor substrate 61, the surface being opposite to the light incident surface. The side of the surface opposite to the light incident surface is the inner side of the lower surface in FIG. 2. The signal extraction section 65-1 and the signal extraction section 65-2 correspond respectively to the first tap TA and the second tap TB in FIG. 1.

As depicted in FIG. 2, the signal extraction section 65-1 includes an N+ semiconductor region 71-1 which is an N-type semiconductor region and a P+ semiconductor region 72-1 which is a P-type semiconductor region. Similarly, the signal extraction section 65-2 includes an N+ semiconductor region 71-2 which is an N-type semiconductor region and a P+ semiconductor region 72-2 which is a P-type semiconductor region.

In plan view, the N+ semiconductor region 71-1 is formed into a circular shape (doughnut-like shape) to surround the P+ semiconductor region 72-1 with the P+ semiconductor region 72-1 set at the center, as depicted in FIG. 3. Similarly, the N+ semiconductor region 71-2 is also formed into a circular shape (doughnut-like shape) to surround the P+ semiconductor region 72-2 with the P+ semiconductor region 72-2 set at the center.

Further, between the P+ semiconductor region 72-1 which is located on the inner side and the N+ semiconductor region 71-1 which is located on the outer side in the signal extraction section 65-1, an oxide film 73-1 is formed as a separation part for separating these semiconductor regions from each other. In addition, also at the outer circumference of the N+ semiconductor region 71-1, an oxide film 74-1 is formed as a separation part for separation from any other region. The oxide film 73-1 and the oxide film 74-1 are formed by STI (Shallow Trench Isolation), for example.

Similarly, also between the P+ semiconductor region 72-2 which is located on the inner side and the N+ semiconductor region 71-2 which is located on the outer side in the signal extraction section 65-2, an oxide film 73-2 is formed as a separation part for separating these semiconductor regions from each other. Further, also at the outer circumference of the N+ semiconductor region 71-2, an oxide film 74-2 is formed as a separation part for separation from any other region. The oxide film 73-2 and the oxide film 74-2 are formed by STI, for example.

In the following description, the signal extraction section 65-1 and the signal extraction section 65-2 are each simply referred to as a signal extraction section 65, in the case where it is not necessary to distinguish these sections from each other. Also, the N+ semiconductor region 71-1 and the N+ semiconductor region 71-2 are each simply referred to as an N+ semiconductor region 71, in the case where it is not necessary to distinguish these regions from each other. The P+ semiconductor region 72-1 and the P+ semiconductor region 72-2 are each simply referred to as a P+ semiconductor region 72, in the case where it is not necessary to distinguish these regions from each other. The oxide films 73-1 and 73-2 are also each simply referred to as an oxide film 73, and the oxide films 74-1 and 74-2 are also each simply referred to as an oxide film 74.

In the semiconductor substrate 61, as a separation part for separating the first tap TA from the second tap TB, a P-well region 75 is formed between the signal extraction sections 65-1 and 65-2 on the front surface side which is the lower side in FIG. 2, and more specifically, between the oxide film 74-1 which is located on the outer side of the signal extraction section 65-1 and the oxide film 74-2 which is located on the outer side of the signal extraction section 65-2.

In plan view in FIG. 3, the signal extraction sections 65 each include the P+ semiconductor region 72 serving as a voltage application section and being disposed at the center and the N+ semiconductor region 71 serving as a charge detection section and being disposed to surround the P+ semiconductor region 72. The signal extraction sections 65-1 and 65-2 are arranged at symmetric positions with respect to the pixel center portion of the pixel PX.

In addition, as depicted in FIG. 3, a pixel transistor region 77 where a plurality of pixel transistors Tr including a transfer transistor 101 and an amplification transistor 106, which will be explained later with reference to FIG. 4, are disposed is formed at a pixel boundary portion between a plurality of the pixels PX that are arranged in a matrix shape. In addition, as depicted in B in FIG. 2, a P-well region 76 is formed on the front surface side of the semiconductor substrate 61, so as to correspond to the pixel transistor region 77.

The multilayer wiring layer 91 is formed on the side of a surface of the semiconductor substrate 61, the surface being opposite to the light incident surface. The surface opposite to the light incident surface is a lower surface in FIG. 2. In other words, the semiconductor substrate 61 which is a semiconductor layer is disposed between the on-chip lens 62 and the multilayer wiring layer 91. The multilayer wiring layer 91 includes five layers, that is, metal films M1 to M5, and an inter-layer insulating film 92 that is disposed among the metal films. It is to be noted that, in A in FIG. 2, the outermost metal film M5 of the metal films M1 to M5 lacks because the metal film M5 is located at a hidden position, but in B in FIG. 2, the metal film M5 is depicted.

Of the five-layered metal films M1 to M5 of the multilayer wiring layer 91, the metal film M1 that is closest to the semiconductor substrate 61 includes a voltage application line 93 for applying a predetermined voltage MIX0 or MIX1 to the P+ semiconductor region 72-1 or 72-2 and a reflecting member 94 that reflects incident light. The reflecting member 94 also serves as a light shielding member that shields infrared light so as to prevent the incident light from entering any layer below the metal film M1.

In addition to the voltage application line 93 for applying the predetermined voltage MIX0 or MIX1 to the P+ semiconductor region 72 serving as a voltage application section, a signal extraction line 95 that is connected to a portion of the N+ semiconductor region 71 serving as a charge detection section is formed in the metal film M1. The signal extraction line 95 transmits an electric charge detected in the N+ semiconductor region 71 to an FD 102 (FIG. 4).

As depicted in B in FIG. 2, the signal extraction section 65-2 (second tap TB) is connected to the voltage application line 93 in the metal film M1, and the voltage application line 93 is electrically connected to a line 96 in the metal film M4 through a via. The line 96 in the metal film M4 is connected to the voltage supply line 30 in the metal film M5 through a via. The voltage supply line 30 in the metal film M5 is connected to the tap driving section 21. Accordingly, the predetermined voltage MIX1 is supplied from the tap driving section 21 to the P+ semiconductor region 72-2 serving as a voltage application section, via the voltage supply line 30 in the metal film M5, the line 96 in the metal film M4, and the voltage application line 93.

In a similar manner, in a non-depicted region of the pixel PX, the predetermined voltage MIX1 is supplied from the tap driving section 21 to the P+ semiconductor region 72-1 serving as a voltage application section of the signal extraction section 65-1 (first tap TA), via the voltage supply line 30 in the metal film M5, the line 96 in the metal film M4, and the voltage application line 93. It is to be noted that the voltage supply line 30, the line 96, and the voltage application line 93 connected to the first tap TA are different from those connected to the second tap TB.

As described above, the pixel PX in FIG. 2 has a back-illuminated-type pixel structure in which the light incident surface of the semiconductor substrate 61 is what is generally called a rear surface that is opposite to the multilayer wiring layer 91 side.

The N+ semiconductor region 71 disposed in the semiconductor substrate 61 functions as a charge detection section for detecting a light quantity of light incident on the pixel PX from the outside, that is, the quantity of signal charges generated by photoelectric conversion in the semiconductor substrate 61.

In addition, the P+ semiconductor region 72 functions as a voltage application section for injecting multiple carrier currents to the semiconductor substrate 61, that is, for generating an electric field in the semiconductor substrate 61 by applying voltage directly to the semiconductor substrate 61.

<3. Configuration Example of Equivalent Circuit of Pixel>

FIG. 4 depicts an equivalent circuit of the pixel PX.

It is to be noted that an equivalent circuit of the pixel 51 which will be explained later is also configured in the same manner as the equivalent circuit of the pixel PX depicted in FIG. 4.

For the signal extraction section 65-1 (first tap TA) including the N+ semiconductor region 71-1 and the P+ semiconductor region 72-1, the pixel PX includes a transfer transistor 101A, an FD 102A, an additional capacitance 103A, a switching transistor 104A, a reset transistor 105A, an amplification transistor 106A, and a selection transistor 107A.

Also, for the signal extraction section 65-2 (second tap TB) including the N+ semiconductor region 71-2 and the P+ semiconductor region 72-2, the pixel PX includes a transfer transistor 101B, an FD 102B, an additional capacitance 103B, a switching transistor 104B, a reset transistor 105B, an amplification transistor 106B, and a selection transistor 107B.

The transfer transistors 101 (101A and 101B), the switching transistors 104 (104A and 104B), the reset transistors 105 (105A and, 105B), the amplification transistors 106 (106A and 106B), and the selection transistors 107 (107A and 107B) include N-type MOS transistors.

The tap driving section 21 applies the predetermined voltage MIX0 to the P+ semiconductor region 72-1 via the voltage supply line 30A, and applies the predetermined voltage MIX1 to the P+ semiconductor region 72-2 via the voltage supply line 30B. For example, either the voltage MIX0 or the voltage MIX1 is a positive voltage (e.g., 1.5 V), and the other voltage is 0 V.

Each of the N+ semiconductor regions 71-1 and 71-2 is a charge detection section that detects and stores an electric charge generated by photoelectric conversion of light incident on the semiconductor substrate 61.

When a transfer driving signal TRG being supplied to a gate electrode of the transfer transistor 101A enters an active state, the transfer transistor 101A responsively enters a conductive state, whereby the transfer transistor 101A transfers the electric charge stored in the N+ semiconductor region 71-1 to the FD 102A. When a transfer driving signal TRG being supplied to a gate electrode of the transfer transistor 101B enters an active state, the transfer transistor 101B responsively enters a conductive state, whereby the transfer transistor 101B transfers the electric charge stored in the N+ semiconductor region 71-2 to the FD 102B.

The FD 102A temporarily holds the electric charge supplied from the N+ semiconductor region 71-1. The FD 102B temporarily holds the electric charge supplied from the N+ semiconductor region 71-2.

When an FD driving signal FDG being supplied to a gate electrode of the switching transistor 104A enters an active state, the switching transistor 104A responsively enters a conductive state, whereby the switching transistor 104A connects the additional capacitance 103A to the FD 102A. When an FD driving signal FDG being supplied to a gate electrode of the switching transistor 104B enters an active state, the switching transistor 104B responsively enters a conductive state, whereby the switching transistor 104B connects the additional capacitance 103B to the FD 102B.

For example, during a high light-level time when the light quantity of incident light is large, the vertical driving section 22 establishes connection between the FD 102A and the additional capacitance 103A and connection between the FD 102B and the additional capacitance 103B, by setting each of the switching transistors 104A and 104B into an active state. Accordingly, a large quantity of electric charges can be stored during a high light-level time.

On the other hand, during a low light-level time when the light quantity of incident light is small, the vertical driving section 22 disconnects the additional capacitances 103A and 103B from the FDs 102A and 102B, respectively, by setting each of the switching transistors 104A and 104B into an inactive state. Accordingly, the conversion efficiency can be enhanced.

When a reset driving signal RST being supplied to a gate electrode of the reset transistor 105A enters an active state, the reset transistor 105A responsively enters a conductive state, whereby the potential of the FD 102A is reset to a predetermined level (reset voltage VDD). When a reset driving signal RST being supplied to a gate electrode of the reset transistor 105B enters an active state, the reset transistor 105B responsively enters a conductive state, whereby the potential of the FD 102B is reset to a predetermined level (reset voltage VDD). It is to be noted that, when the reset transistors 105A and 105B enter the active state, the transfer transistors 101A and 101B simultaneously enter the active state.

When a source electrode of the amplification transistor 106A is connected to the vertical signal line 29A via the selection transistor 107A, an unillustrated constant current source and a source follower circuit are formed. When a source electrode of the amplification transistor 106B is connected to the vertical signal line 29B via the selection transistor 107B, an unillustrated constant current source and a source follower circuit are formed.

The selection transistor 107A is connected between the source electrode of the amplification transistor 106A and the vertical signal line 29A. When a selection signal SEL being supplied to a gate electrode of the selection transistor 107A enters an active state, the selection transistor 107A responsively enters a conductive state, and outputs, to the vertical signal line 29A, a detection signal VSL outputted from the amplification transistor 106A.

The selection transistor 107B is connected between the source electrode of the amplification transistor 106B and the vertical signal line 29B. When a selection signal SEL being supplied to a gate electrode of the selection transistor 107B enters an active state, the selection transistor 107B responsively enters a conductive state, and outputs, to the vertical signal line 29B, a detection signal VSL outputted from the amplification transistor 106B.

The transfer transistors 101A and 101B, the reset transistors 105A and 105B, the amplification transistors 106A and 106B, and the selection transistors 107A and 107B in the pixel PX are under the control of the vertical driving section 22.

In the equivalent circuit in FIG. 4, the additional capacitances 103A and 103B and the switching transistors 104A and 104B that control the connection states of these capacitances may be omitted. However, providing the additional capacitance 103 so as to be selectively used according to the quantity of incident light allows a high dynamic range to be secured.

<Charge Detection Operation of Pixel>

A detection operation of the pixel PX will be explained with reference to FIGS. 2 and 4.

In a case where a distance to an object is measured by indirect ToF, infrared light is emitted from an imaging device equipped with the light reception element 1 toward the object, for example. Subsequently, after being reflected by the object, the infrared light returns, as reflection light, to the imaging device, and then, the light reception element 1 receives the incident reflection light (infrared light) and performs photoelectric conversion thereon.

Here, by driving each of the pixels PX, the vertical driving section 22 allocates electric charges obtained by the photoelectric conversion, to the FD 102A which is connected to the N+ semiconductor region 71-1 serving as one electric charge detection section (first charge detection section) and the FD 102B which is connected to the N+ semiconductor region 71-2 serving as the other charge detection section (second charge detection section).

More specifically, at a certain timing, the vertical driving section 22 applies the predetermined voltages to the two P+ semiconductor regions 72 via the voltage supply lines 30, etc. For example, the tap driving section 21 applies a positive voltage (e.g., 1.5 V) to the P+ semiconductor region 72-1, and applies a voltage of 0 V to the P+ semiconductor region 72-2.

As a result, an electric field is generated between the two P+ semiconductor regions 72 in the semiconductor substrate 61, and current flows from the P+ semiconductor region 72-1 to the P+ semiconductor region 72-2. In this case, a hole in the semiconductor substrate 61 moves toward the P+ semiconductor region 72-2, and an electron moves toward the P+ semiconductor region 72-1.

Accordingly, during such a state, infrared light (reflection light) from the outside is incident on the semiconductor substrate 61 via the on-chip lens 62, and the infrared light is converted to an electron-hole pair through photoelectric conversion in the semiconductor substrate 61 serving as a photoelectric conversion section, and the obtained electron is introduced toward the P+ semiconductor region 72-1 by the electric field between the P+ semiconductor regions 72, and moves toward the inside of the N+ semiconductor region 71-1.

In this case, the electron generated by the photoelectric conversion is used as a signal carrier for detecting the quantity of the infrared light incident on the pixel PX, that is, detecting a signal depending on the quantity of the received infrared light.

Thus, an electric charge corresponding to the electron having arrived in the N+ semiconductor region 71-1 is detected in the N+ semiconductor region 71-1, and is stored into the FD 102A. In a case where the switching transistor 104A is in an active state, the electric charge is stored also in the additional capacitance 103A. When the pixel PX is selected, a signal corresponding to this electric charge is outputted to the column processing section 23 via the vertical signal line 29A, etc.

Subsequently, the signal is read, and is subjected to AD conversion by the column processing section 23. The resultant AD conversion value of a detection signal VSL is supplied to the signal processing section 31. The AD conversion value of the detection signal VSL is the quantity of electric charges detected in the N+ semiconductor region 71-1, that is, a value representing the light quantity of infrared light received by the pixel PX.

Further, at the following timing, the tap driving section 21 applies voltages to the two P+ semiconductor regions 72 so as to generate an electric field opposite to the electric field previously generated in the semiconductor substrate 61. Specifically, a voltage of 0 V is applied to the P+ semiconductor region 72-1, and a positive voltage (e.g., 1.5 V) is applied to the P+ semiconductor region 72-2, for example.

As a result, an electric field is generated between the two P+ semiconductor regions 72 in the semiconductor substrate 61, and current flows from the P+ semiconductor region 72-2 to the P+ semiconductor region 72-1.

During such a state, infrared light (reflection light) from the outside is incident on the semiconductor substrate 61 via the on-chip lens 62, and the infrared light is converted to an electron-hole pair through photoelectric conversion in the semiconductor substrate 61 serving as a photoelectric conversion section, and the obtained electron is introduced toward the P+ semiconductor region 72-2 by the electric field between the P+ semiconductor regions 72, and moves toward the inside of the N+ semiconductor region 71-2.

Thus, an electric charge corresponding to the electron having arrived in the N+ semiconductor region 71-2 is detected in the N+ semiconductor region 71-2, and is stored into the FD 102B. In a case where the switching transistor 104B is in an active state, the electric charge is stored also into the additional capacitance 103B. When the pixel PX is selected, a signal corresponding to this electric charge is outputted to the column processing section 23 via the vertical signal line 29B, etc.

Subsequently, the signal is read, and is subjected to AD conversion by the column processing section 23. The resultant AD conversion value of a detection signal VSL is supplied to the signal processing section 31. The AD conversion value of the detection signal VSL is the quantity of electric charges detected in the N+ semiconductor region 71-2, that is, a value representing the light quantity of infrared light received by the pixel PX.

In the abovementioned manner, when detection signals VSL obtained by photoelectric conversion during different time periods in the same pixel PX are obtained, the signal processing section 31 calculates distance information indicating the distance to the object on the basis of the detection signals VSL, and outputs the distance information to a subsequent stage section.

A method of allocating signal carriers into the different N+ semiconductor regions 71 and calculating distance information on the basis of signals corresponding to these signal carriers, in the abovementioned manner, is called indirect ToF.

Here, the signal extraction section 65 that reads out a signal corresponding to an electric charge (electron) obtained by photoelectric conversion, that is, the signal extraction section 65 that is to detect an electric charge obtained by photoelectric conversion, is also referred to as an active tap.

In contrast, the signal extraction section 65 that basically does not read out a signal corresponding to an electric charge obtained by photoelectric conversion, that is, the signal extraction section 65 that is not an active tap, is also referred to as an inactive tap.

In the above example, the signal extraction section 65 in which a positive voltage is applied to the P+ semiconductor region 72 is an active tap, while the signal extraction section 65 in which a voltage of 0 V is applied to the P+ semiconductor region 72 is an inactive tap.

As explained so far, in the pixel PX having a CAPD structure, a positive voltage (e.g., 1.5 V) is applied to the voltage application section of one of the two taps that are arranged at symmetric positions with respect to the pixel center portion, and a voltage of 0 V is applied to the voltage application section of the other tap. As a result, an electric field is generated between the two taps to cause a current flow, and a signal electric charge generated by photoelectric conversion is introduced to the charge detection section of the other tap, and is collected.

Figure 5:
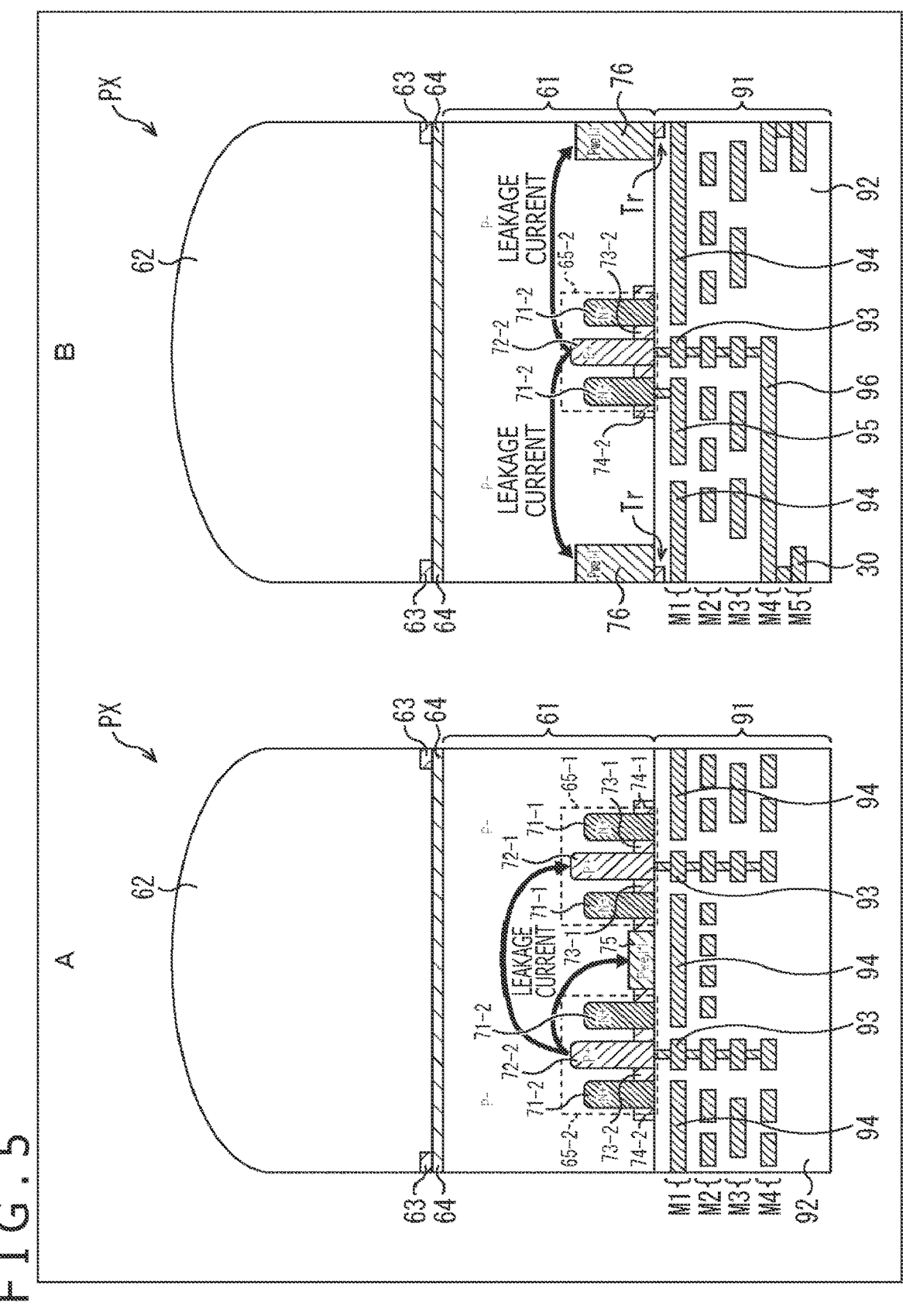
FIG. 5 depicts diagrams for explaining leakage current which is generated in a pixel in the comparative example.

Meanwhile, in the pixel PX, the P-well region 75 formed by P-type ion implantation separates the two taps from each other, as depicted in A in FIG. 5. During a modulation time, in addition to current flowing between the two P+ semiconductor regions 72, leakage current also flows to the P-well region 75 formed including a P-type semiconductor region similar to the voltage application sections of the taps. Accordingly, current consumption becomes large. Further, leakage current also flows to the P-well region 76 in the pixel transistor region 77, as depicted in A in FIG. 5. Accordingly, current consumption becomes large. Therefore, the pixels 51 that are formed in the pixel array section 20 of the light reception element 1 each adopt a structure to reduce leakage current and decrease current consumption.

<4. First Configuration Example of Pixel>

Figure 7:
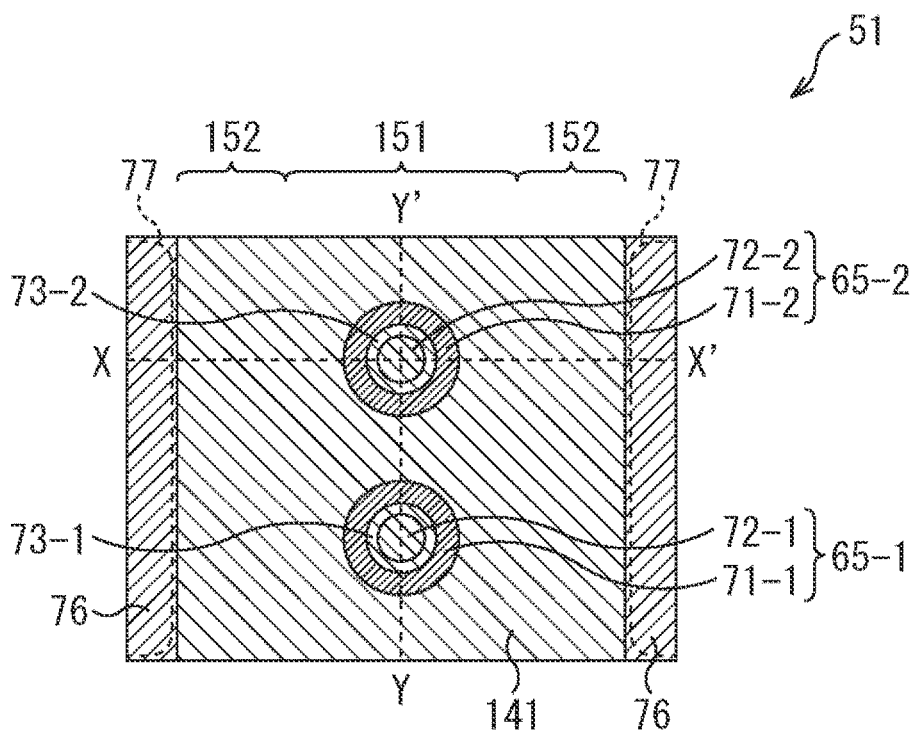
FIG. 7 is a plan view of the first configuration example of the pixel in FIG. 1.

FIGS. 6 and 7 each depict a first configuration example of the pixel 51.

FIG. 6 is a cross-sectional view of the pixel 51 according to the first configuration example. FIG. 7 is a plan view of the pixel 51 according to the first configuration example. In FIG. 6, A illustrates a cross-sectional view taken along line Y-Y' in FIG. 7, and B illustrates a cross-sectional view taken along line X-X' in FIG. 7.

It is to be noted that components in FIGS. 6 and 7 corresponding to those of the pixel PX depicted in FIGS. 2 and 3 are denoted by the same reference signs, and an explanation thereof will be omitted, as appropriate. Differences from the pixel PX will be explained. In addition, only a portion of the multilayer wiring layer 91 is depicted in FIG. 6.

In the first configuration example, on the front surface side (lower side in FIG. 6) of the semiconductor substrate 61, an oxide film (embedded oxide film) 141 is formed in a region between the N+ semiconductor region 71-1 of the signal extraction section 65-1 and the N+ semiconductor region 71-2 of the signal extraction section 65-2, as depicted in A in FIG. 6. Further, the oxide film (embedded oxide film) 141 is also formed in a region between the N+ semiconductor region 71 serving as a charge detection section and the P-well region 76 serving as a pixel boundary portion, as depicted in B in FIG. 6. The oxide films 141 are formed by STI, for example.

In other words, as depicted in the plan view in FIG. 7, the oxide film 141 is formed all over the front surface side of the substrate in the pixel 51, except the two signal extraction sections 65 and the P-well region 76 in the pixel transistor region 77.

Here, as depicted in FIG. 7, a flat region of the front surface side of the substrate on which the oxide film 141 is formed is sectioned into a tap peripheral region 151 that is near the taps and a pixel transistor neighboring region 152 that is near the P-well region 76 in the pixel transistor region 77. In the example in FIG. 7, the tap peripheral region 151 and the pixel transistor neighboring region 152 are sectioned along a row direction that is orthogonal to the arrangement direction of the signal extraction section 65-1 and the signal extraction section 65-2. It is to be noted that the region ratio of the tap peripheral region 151 and the pixel transistor neighboring region 152 can be set to any ratio.

As depicted in B in FIG. 6, the upper surface (interface in the semiconductor substrate 61) of the oxide film 141 in the tap peripheral region 151 is covered with a P+ semiconductor region 143, and the upper surface of the oxide film 141 in the pixel transistor neighboring region 152 is covered with a P semiconductor region 144. The impurity concentration in the P+ semiconductor region 143 and the impurity concentration in the P semiconductor region 144 are set in such a way that the impurity concentration in the P semiconductor region 144 is higher than the substrate concentration of the semiconductor substrate 61 and that the impurity concentration in the P+ semiconductor region 143 is higher than that in the P semiconductor region 144. It is to be noted that the impurity concentration in the P+semiconductor region 143 and the impurity concentration in the P semiconductor region 144 may be equal to each other as long as the impurity concentration in both the semiconductor regions is higher than the substrate concentration of the semiconductor substrate 61.

Further, as depicted in A in FIG. 6, the upper surface (interface in the semiconductor substrate 61) of the oxide film 141 between the N+ semiconductor region 71-1 of the signal extraction section 65-1 and the N+ semiconductor region 71-2 of the signal extraction section 65-2 is covered with a P-well region 142. As in the pixel PX, the P-well region 142 is formed by ion implantation, and then, the oxide film 141 is formed, so that only a portion of the P-well region 142 deeper than the oxide film 141 remains to cover the substrate inner-side interface of the oxide film 141. Also in the P+ semiconductor region 143 and the P semiconductor region 144, the P+ semiconductor region 143 and the P semiconductor region 144 are formed at a predetermined depth by ion implantation prior to formation of the oxide film 141.

Consequently, when the pixel 51 according to the first configuration example is compared with the abovementioned pixel PX, the oxide film 141 is provided in place of the P-well region 75 between the two taps formed on the front surface side of the substrate, and the oxide film 141 is formed even between the signal extraction section 65 and the P-well region 76 in the pixel transistor region 77. Accordingly, leakage current which has been explained with reference to A and B in FIG. 5 can be reduced to decrease current consumption.

In addition, the interface of the oxide film 141 in the semiconductor substrate 61 is covered with any one of the P-well region 142, the P+ semiconductor region 143, or the P semiconductor region 144. Accordingly, occurrence of dark current due to a crystal defect or the like on the interface of the oxide film 141 can be inhibited.

Figure 8:
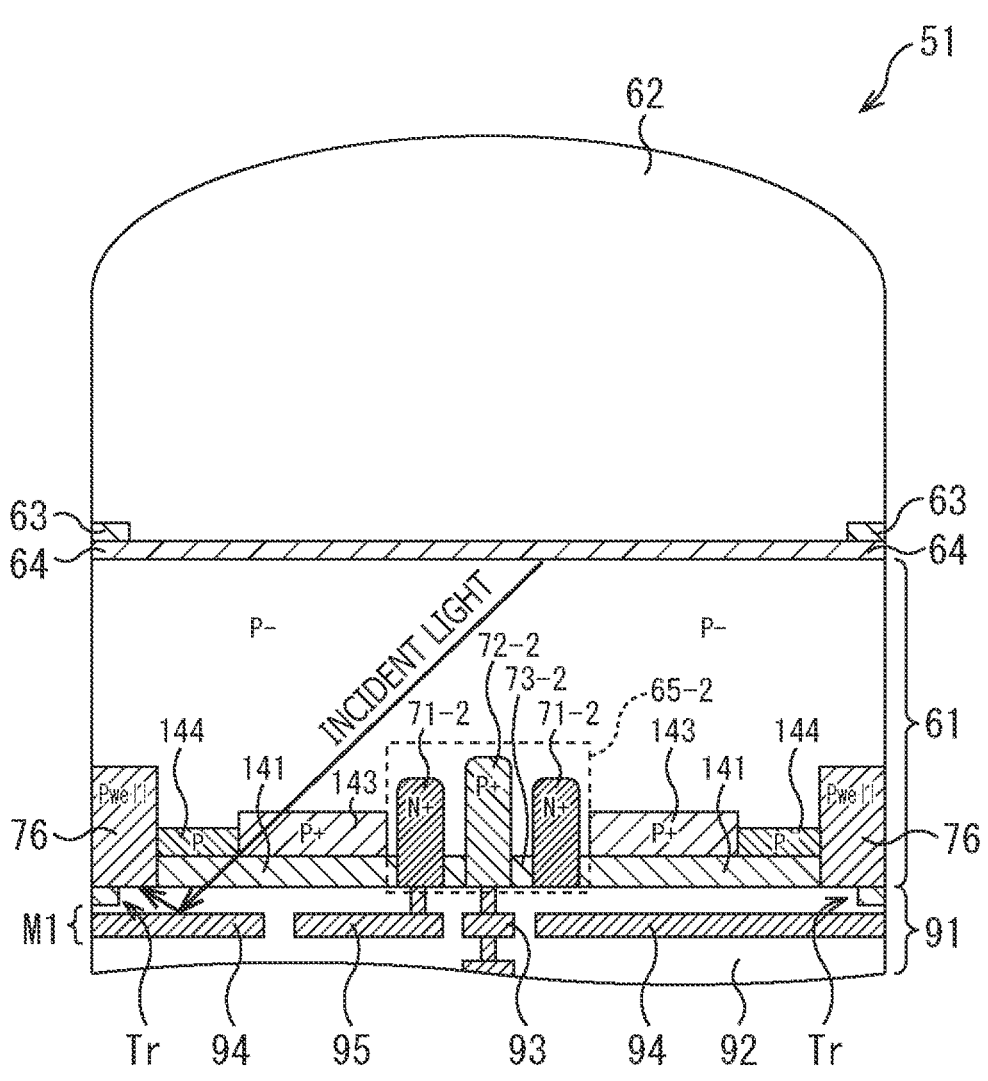
FIG. 8 is a diagram for explaining an effect of the first configuration example.

Further, since the oxide film 141 is formed between the signal extraction section 65 and the P-well region 76 in the pixel transistor region 77, incident light that is to pass through the semiconductor substrate 61 can be absorbed (blocked) by the oxide film 141. Thus, as depicted in FIG. 8, incident light having passed through the semiconductor substrate 61 is reflected by the reflecting member 94, so that the light is prevented from being incident on the FD 102 formed in the P-well region 76. Accordingly, the parasitic light sensitivity (PLS) can be reduced.

Figure 9:
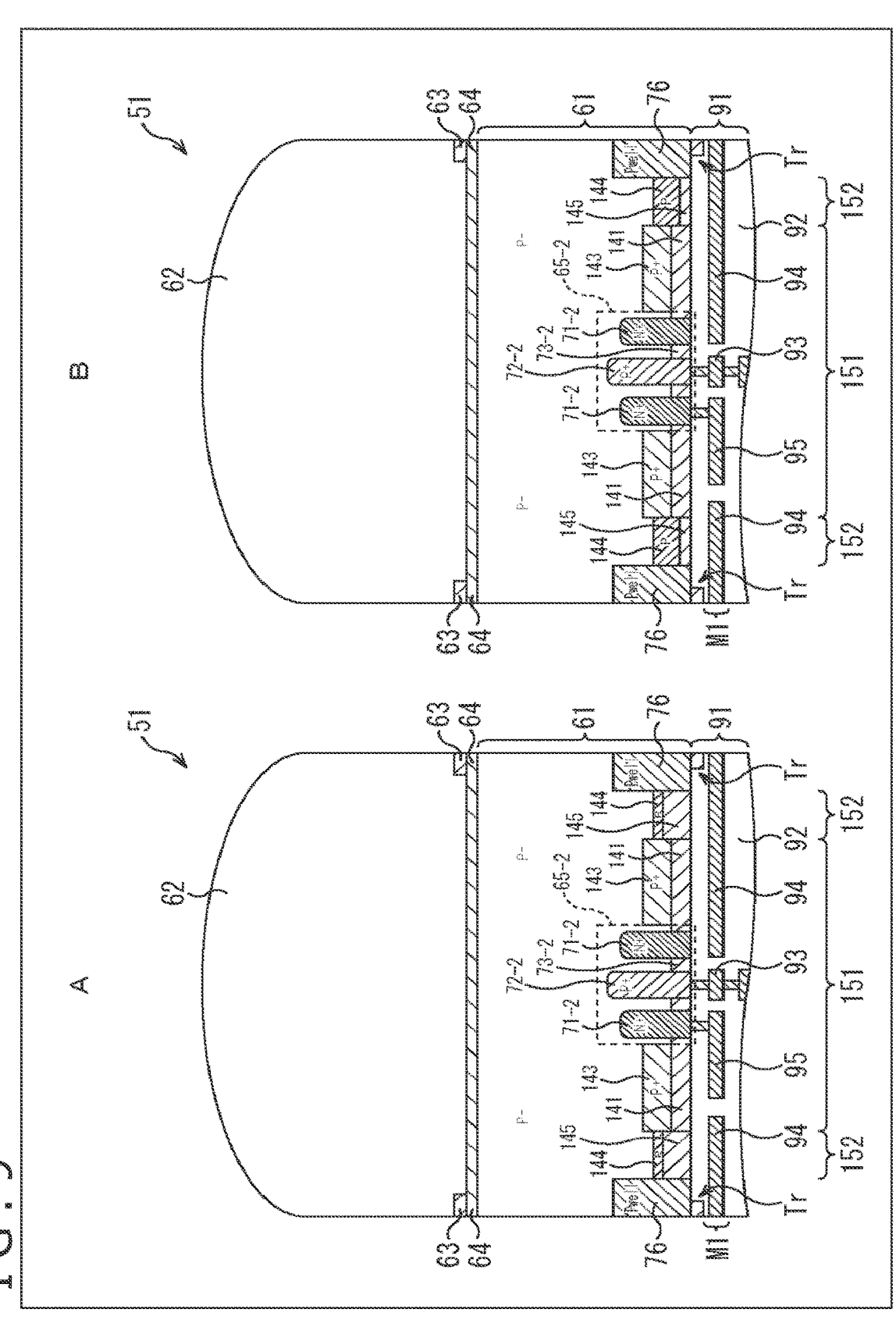
FIG. 9 depicts cross-sectional views of a modification of the first configuration example.

In FIG. 9, A and B are cross-sectional views of a modification of the first configuration example.

In the first configuration example depicted in FIG. 6, the oxide film 141 is formed in such a way that, with respect to the substrate front surface-side interface, the depth (thickness) of the oxide film 141 in the tap peripheral region 151 covered with the P+ semiconductor region 143 is equal to that in the pixel transistor neighboring region 152 covered with the P semiconductor region 144.

However, with respect to the substrate front surface-side interface, the depth of the oxide film 141 in the tap peripheral region 151 may be different from that in the pixel transistor neighboring region 152.

In FIG. 9, A depicts an example obtained by replacing the oxide film 141 in the pixel transistor neighboring region 152 according to the first configuration example depicted in FIG. 6, with an oxide film 145 that is formed deeper than the oxide film 141 in the tap peripheral region 151.

In FIG. 9, B depicts an example obtained by replacing the oxide film 141 in the pixel transistor neighboring region 152 according to the first configuration example depicted in FIG. 6, with the oxide film 145 that is formed shallower than the oxide film 141 in the tap peripheral region 151.

In the abovementioned manners, oxide films that are formed on the front surface side of the semiconductor substrate 61 may be formed at different depths in the tap peripheral region 151 and the pixel transistor neighboring region 152.

<5. Second Configuration Example of Pixel>

Figure 10:
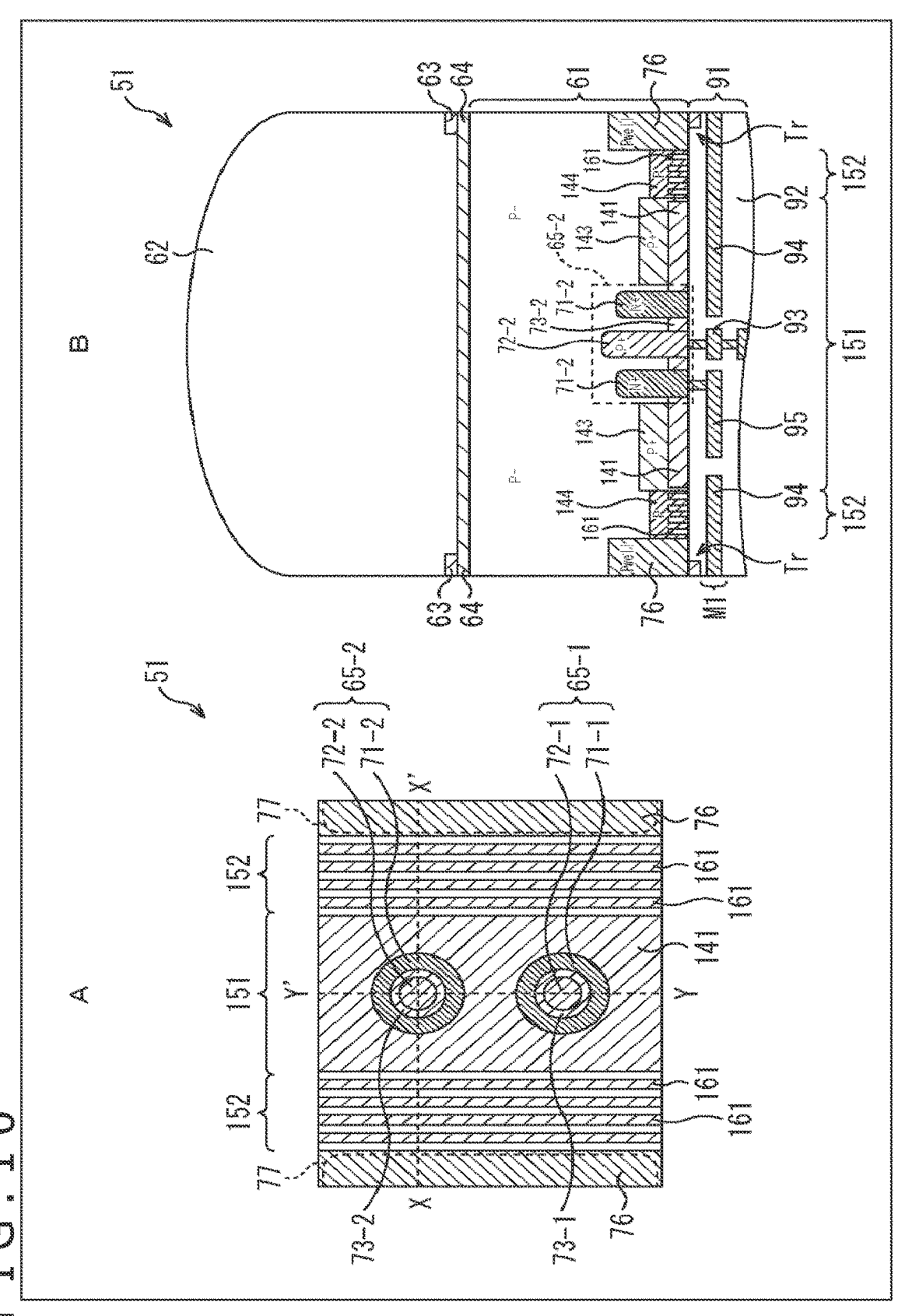
FIG. 10 depicts diagrams depicting a second configuration example of a pixel in the light reception element in FIG. 1.

FIG. 10 depicts a second configuration example of the pixel 51.

In FIG. 10, A is a plan view of the pixel 51 according to the second configuration example, and B depicts a cross-sectional view of the pixel 51 taken along line X-X' in FIG. 10. It is to be noted that an illustration of a cross-sectional view taken along line Y-Y' in FIG. 10 is omitted because this cross-sectional view is identical to that of the first configuration example illustrated in A in FIG. 6.

Components in FIG. 10 corresponding to those of the first configuration example depicted in FIGS. 6 and 7 are denoted by the same reference signs, and an explanation thereof will be omitted, as appropriate.

In the first configuration example, a flat region in the pixel 51, except the two signal extraction sections 65 and the P-well region 76 in the pixel transistor region 77, is sectioned, along the row direction, into the tap peripheral region 151 and the pixel transistor neighboring region 152, and the oxide film 141 is formed all over the tap peripheral region 151 and the pixel transistor neighboring region 152.

In contrast, in the second configuration example, the oxide film 141 identical to that of the first configuration example is formed in the tap peripheral region 151, but two or more oxide films 161 each having a linear shape that is long in the column direction (longitudinal direction) are formed in each of the pixel transistor neighboring regions 152 on both sides of the tap peripheral region 151. The oxide films 161 are formed in a stripe shape in which two or more oxide films are arranged at a predetermined interval with spaces provided therebetween. As depicted in B in FIG. 10, the upper surfaces of a plurality of the oxide films 161 arranged in the stripe shape are covered with the P semiconductor region 144, as in the first configuration example. It is to be noted that the example in which the stripe pattern of the oxide films 161 in each of the pixel transistor neighboring regions 152 is along the column direction is illustrated in FIG. 10. Alternatively, the stripe pattern may be along the row direction.

As described above, even in the case where the two or more oxide films 161 each having a linear shape and being arranged in a stripe shape are formed on the substrate front surface side in the pixel transistor neighboring region 152, leakage current which has been explained with reference to A and B in FIG. 5 can be reduced to decrease current consumption. In addition, incident light passing through the semiconductor substrate 61 is absorbed, so that the parasitic light sensitivity can be reduced. Further, the oxide films 141 and 161 are covered with the P+ semiconductor region 143 or the P semiconductor region 144, so that occurrence of dark current can be inhibited.

Furthermore, the oxide films are formed in the semiconductor substrate 61 by an STI process. In this case, at a step for digging grooves for embedding the oxide films, the plurality of stripe-shaped oxide films 161 according to the second configuration example are formed in regions thinner than such a wide region as that of the oxide film 141 according to the first configuration example. Thus, the process stability can be enhanced. Accordingly, the oxide film 141 and the oxide films 161 can be formed with precision.

In FIG. 11, A and B are cross-sectional views of a modification of the second configuration example.

In the second configuration example depicted in FIG. 10, the depth, with respect to the substrate front surface-side surface, of the oxide films 161 arranged in the stripe pattern in the pixel transistor neighboring region 152 is equal to the depth of the oxide film 141 in the tap peripheral region 151.

However, the depth, with respect to the substrate front surface-side surface, of a plurality of the oxide films 161 arranged in the stripe pattern may be set different from the depth of the oxide film 141 in the tap peripheral region 151.

In FIG. 11, A depicts an example in which a plurality of the oxide films 161 in the pixel transistor neighboring region 152 are formed deeper than the oxide film 141 in the tap peripheral region 151.

In FIG. 11, B depicts an example in which a plurality of the oxide films 161 in the pixel transistor neighboring region 152 are formed shallower than the oxide film 141 in the tap peripheral region 151.

In the abovementioned manner, the depths of the oxide films 141 and 161 in the tap peripheral region 151 and the pixel transistor neighboring region 152 can be set to any depth.

<6. Third to Fifth Configuration Examples of Pixel>

Figure 12:
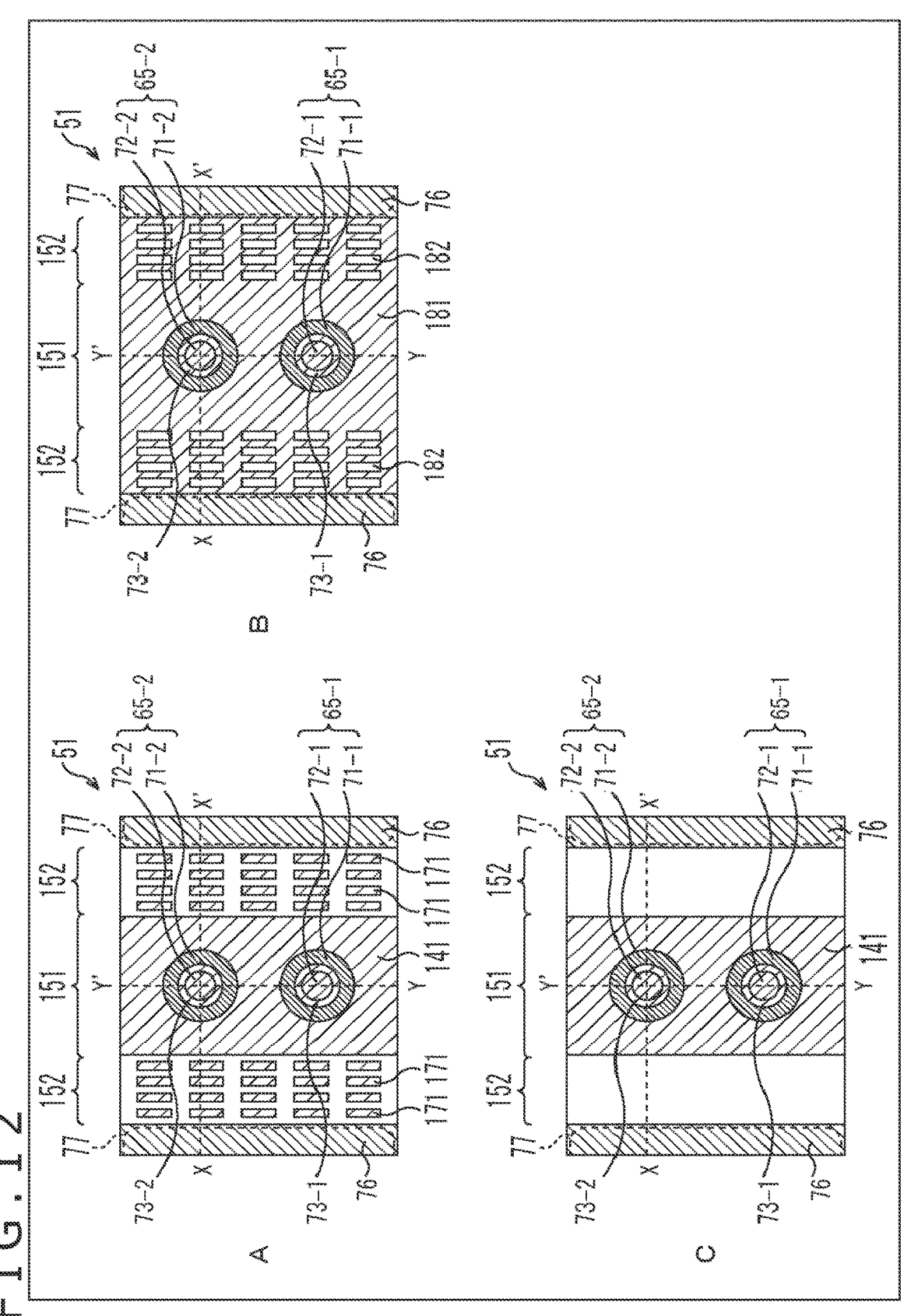
FIG. 12 depicts diagrams depicting third to fifth configuration examples of the pixel in FIG. 1.

FIG. 12 depicts third to fifth configuration examples of the pixel 51.

Components in FIG. 12 corresponding to those of the first configuration example or the second configuration example are denoted by the same reference signs, and an explanation thereof will be omitted, as appropriate.

In FIG. 12, A is a plan view of the pixel 51 according to the third configuration example.

The pixel 51 according to the third configuration example is different from those of the abovementioned first and second configuration examples in a pattern configuration of oxide films formed in the pixel transistor neighboring region 152.

In the pixel transistor neighboring region 152 according to the third configuration example, oxide films 171 each having a rectangular shape are formed into an array pattern in which two or more oxide films 171 are regularly arranged in each of the column direction and the row direction at a predetermined interval with spaces provided therebetween. In other words, in each of the two pixel transistor neighboring regions 152, the oxide films 171 each having a rectangular shape are arranged into an array shape, and the space where none of the oxide films 171 are formed is formed into a lattice shape.

A cross-sectional view taken along line X-X' in A in FIG. 12 is, for example, similar to that according to the second configuration example depicted in B in FIG. 10; a cross-sectional view taken along line Y-Y' in A in FIG. 12 is identical to that according to the first configuration example depicted in A in FIG. 6.

In FIG. 12, B is a plan view of the pixel 51 according to the fourth configuration example.

The fourth configuration example is configured by inverting the oxide film pattern in the pixel transistor neighboring region 152 according to the third configuration example depicted in A in FIG. 12. Specifically, in the fourth configuration example, an oxide film 181 is formed all over the tap peripheral region 151, and the oxide film 181 is formed, in the pixel transistor neighboring region 152, into a lattice-shaped pattern in which two or more spaces 182 each having a rectangular shape are regularly disposed at a predetermined interval in each of the column direction and the row direction.

A cross-sectional view taken along line X-X' in B in FIG. 12 has, for example, a shape similar to that of the cross-sectional view of the second configuration example depicted in B in FIG. 10; a cross-sectional view taken along line Y-Y' in B in FIG. 12 is identical to that of the first configuration example depicted in A in FIG. 6.

It is to be noted that, in the abovementioned third and fourth configuration examples, the oxide films 171 or the spaces 182 formed in the pixel transistor neighboring region 152 each have a longitudinally long rectangular shape that is long in the column direction rather than in the row direction. However, each of the oxide films 171 or the spaces 182 may be formed into a laterally long rectangular shape that is short in the column direction rather than in the row direction, or may be formed into a square shape. In addition, any defined shapes may be mixed. Moreover, the oxide films 171 and the spaces 182 may be randomly arranged, instead of being regularly arranged as depicted in A and B in FIG. 12. The number of the oxide films 171 and the spaces 182 arranged in each of the row direction and the column direction can also be set to any number. That is, no limitation is imposed on the sizes, the shapes, the number, and the arrangement of the oxide films 171 or the spaces 182 formed in the pixel transistor neighboring region 152, and any design can be adopted.

In FIG. 12, C is a plan view of the pixel 51 according to the fifth configuration example.

The pixel 51 according to the fifth configuration example is different from those of the abovementioned first and second configuration examples in that no oxide film is formed in the pixel transistor neighboring region 152.

A cross-sectional view taken along line X-X' in C in FIG. 12 corresponds to a view obtained by eliminating all the oxide films 161 from the cross-sectional view of the second configuration example depicted in B in FIG. 10, for example. A cross-sectional view taken along line Y-Y' in C in FIG. 12 is identical to that of the first configuration example depicted in A in FIG. 6.

Also in the third to fifth configuration examples, since the oxide films 171 or the oxide films 181 are formed in the tap peripheral region 151 and the pixel transistor neighboring region 152, the leakage current which has been explained with reference to A and B in FIG. 5 can be reduced to decrease current consumption. In addition, incident light passing through the semiconductor substrate 61 is absorbed by the oxide films 171 and the oxide films 181, so that the parasitic light sensitivity can be reduced. Further, the oxide films 171 or the oxide films 181 are covered with either the P+ semiconductor region 143 or the P semiconductor region 144, so that occurrence of dark current can be inhibited.

Further, the oxide films are formed in the semiconductor substrate 61 by an STI process. In this case, at a step for digging grooves for embedding the oxide films, the rectangular oxide films 171 according to the third configuration example or the oxide films 181 with the plurality of spaces 182 provided according to the fourth configuration example are formed in regions thinner than such a wide region as that of the oxide film 141 according to the first configuration example. Thus, the STI process stability can be enhanced. Accordingly, the oxide films 141, 171, and 181 can be formed with precision.

In contrast, in a case where no oxide film 141 is formed in the pixel transistor neighboring region 152 as in the fifth configuration example, the surface area of the bonding interface between the semiconductor substrate 61 and the oxide film 141 is minimized, so that occurrence of dark current can be inhibited.

<7. Sixth Configuration Example of Pixel>

Figure 13:
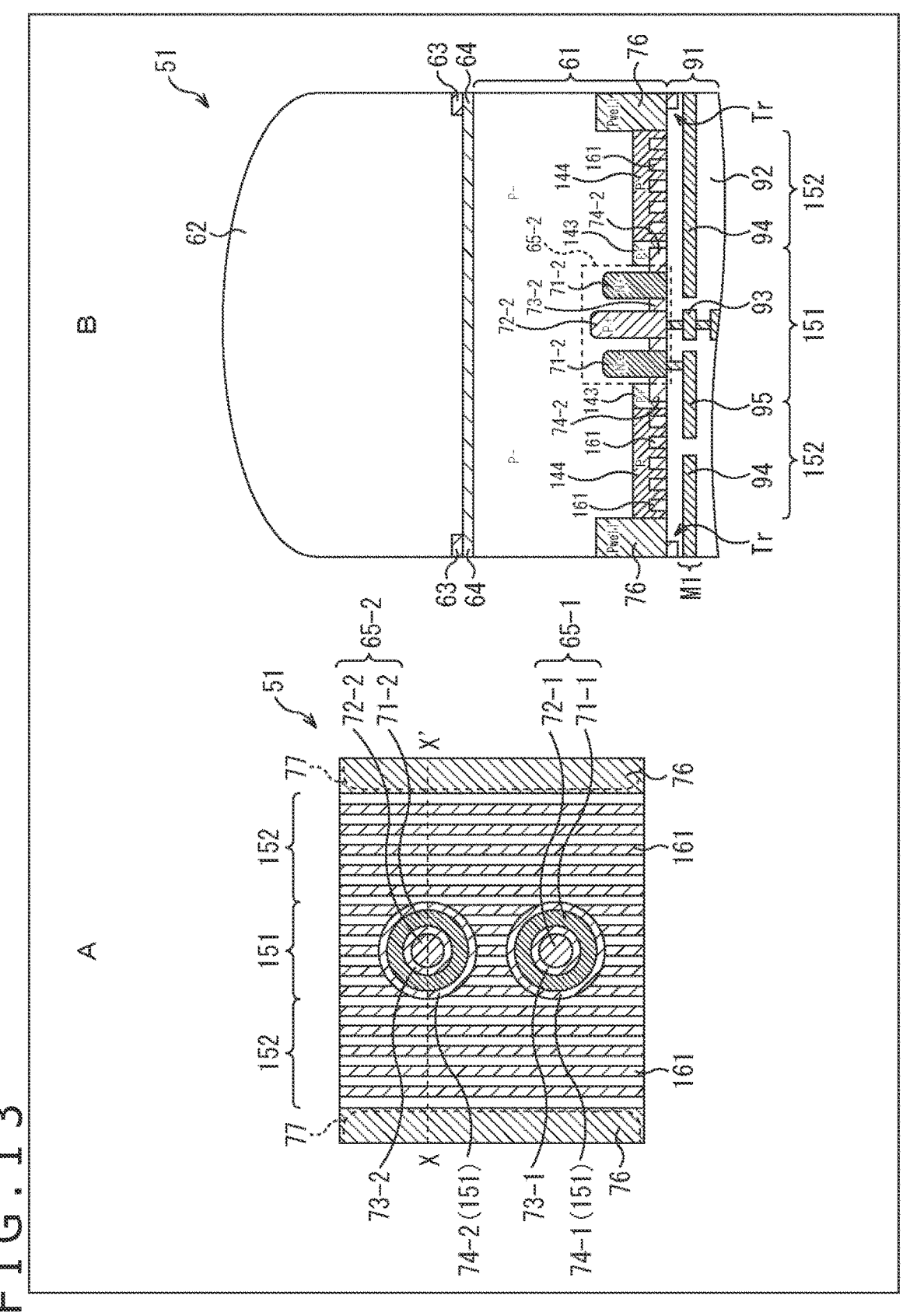
FIG. 13 depicts diagrams depicting a sixth configuration example of the pixel in FIG. 1.

FIG. 13 depicts a sixth configuration example of the pixel 51.

In FIG. 13, A is a plan view of the pixel 51 according to the sixth configuration example, and B depicts a cross-sectional view taken along line X-X' in FIG. 13.

A method for sectioning the tap peripheral region 151 and the pixel transistor neighboring region 152 in the sixth configuration example is different from those in the second to fifth configuration examples depicted in FIGS. 10 to 12.

In the second to fifth configuration examples depicted in FIGS. 10 to 12, a flat region in the pixel 51, except the two signal extraction sections 65 and the P-well region 76 in the pixel transistor region 77, is sectioned, along the row direction, into the tap peripheral region 151 and the pixel transistor neighboring region 152.

In contrast, in the sixth configuration example, in a flat region in the pixel 51, except the two signal extraction sections 65 and the P-well region 76 in the pixel transistor region 77, the oxide films 74-1 and 74-2 having a circular shape and being identical to that in the comparative example in FIG. 3 are each formed at the respective outer peripheral portions of the N+ semiconductor regions 71 serving as a charge detection section, as depicted in FIG. 13. A region where the oxide films 74-1 and 74-2 are formed is defined as the tap peripheral region 151, and the remaining region is defined as the pixel transistor neighboring region 152. It is to be noted that FIG. 13 depicts the tap peripheral region 151 and the pixel transistor neighboring region 152 that are sectioned along the row direction, for the sake of convenience. A region between the taps, that is, a region between the oxide film 74-1 and the oxide film 74-2, is also included in the pixel transistor neighboring region 152.

In the pixel transistor neighboring region 152, the oxide films 161 are formed into a stripe pattern in which the two or more oxide films 161 each having a linear shape that is long in the column direction (longitudinal direction) are arranged in the row direction (lateral direction) at a predetermined interval with spaces therebetween. In other words, the pixel 51 according to the sixth configuration example has a configuration obtained by modifying the second configuration example depicted in A in FIG. 10 in such a way that the oxide film pattern in the pixel transistor neighboring region 152 is extended to the boundary between the oxide films 74-1 and 74-2 which are located on the respective outer peripheral portions of the N+ semiconductor regions 71.

<8. Seventh Configuration Example of Pixel>

FIG. 14 depicts a seventh configuration example of the pixel 51.

In FIG. 14, A is a plan view of the pixel 51 according to the seventh configuration example, B is a cross-sectional view taken along line X1-X1' in FIG. 14, and C depicts a cross-sectional view taken along line X2-X2' in FIG. 14.

A method of sectioning the tap peripheral region 151 and the pixel transistor neighboring region 152 in the seventh configuration example is similar to that in the sixth configuration example depicted in FIG. 13, but the seventh configuration example is different from the sixth configuration example in the oxide film pattern formed in the pixel transistor neighboring region 152.

Specifically, in the pixel transistor neighboring region 152 according to the seventh configuration example, the oxide films 161 are formed into a stripe pattern in which the two or more oxide films 161 each having a linear shape that is long in the row direction are disposed in the column direction. In other words, the pixel 51 according to the seventh configuration example has a configuration obtained by changing the stripe pattern of the oxide films 161 formed along the column direction (longitudinal direction) according to the sixth configuration example depicted in A in FIG. 13 to the stripe pattern formed along the row direction (lateral direction).

In FIG. 14, B is a cross-sectional view of a portion where the oxide film 161 in the stripe pattern is formed, and C is a cross-sectional view of a portion where none of the oxide films 161 in the strip pattern are formed. The upper surfaces (interface in the semiconductor substrate 61) of the oxide films 74-1 and 74-2 in the tap peripheral region 151 are covered with the P+ semiconductor region 143, and the upper surfaces of the oxide films 161 in the pixel transistor neighboring region 152 are covered with the P semiconductor region 144. In a region, in the pixel transistor neighboring region 152, where no oxide film 161 is formed, the P semiconductor region 144 is formed so as to reach the substrate front surface-side surface.

<9. Eighth to Tenth Configuration Examples of Pixel>

FIG. 15 depicts eighth to tenth configuration examples of the pixel 51.

Components in FIG. 15 corresponding to those in the abovementioned configuration examples are denoted by the same reference signs, and an explanation thereof will be omitted, as appropriate.

In FIG. 15, A is a plan view of the pixel 51 according to the eighth configuration example.

A method of sectioning the tap peripheral region 151 and the pixel transistor neighboring region 152 in the eighth configuration example is similar to that in the seventh configuration example in FIG. 14. The eighth configuration example is different from the seventh configuration example in the oxide film pattern formed in the pixel transistor neighboring region 152.

Specifically, in the pixel transistor neighboring region 152 according to the eighth configuration example, the oxide films 171 are formed into an array pattern in which two or more oxide films 171 each having a rectangular shape are regularly arranged in each of the column direction and the row direction at a predetermined interval with spaces provided therebetween. In other words, the pixel 51 according to the eighth configuration example has a configuration obtained by modifying that of the third configuration example depicted in A in FIG. 12 in such a way that the oxide film pattern in the pixel transistor neighboring region 152 is extended to the boundary between the oxide films 74-1 and 74-2 which are located on the respective outer peripheral portions of the N+ semiconductor regions 71.

A cross-sectional view taken along line X-X' in A in FIG. 15 is similar to that of the sixth configuration example depicted in B in FIG. 13, for example.

In FIG. 15, B is a plan view of the pixel 51 according to the ninth configuration example.

A method of sectioning the tap peripheral region 151 and the pixel transistor neighboring region 152 in the ninth configuration example is similar to that in the eighth configuration example in A in FIG. 15. The ninth configuration example is different from the eighth configuration example in the oxide film pattern formed in the pixel transistor neighboring region 152.

Specifically, in the pixel transistor neighboring region 152 according to the ninth configuration example, the oxide film 181 is formed into a lattice-like pattern in which two or more spaces 182 each having a rectangular shape are regularly arranged at a predetermined interval in each of the column direction and the row direction. In other words, the pixel 51 according to the ninth configuration example has a configuration obtained by modifying that of the fourth configuration example depicted in B in FIG. 12 in such a way that the oxide film pattern in the pixel transistor neighboring region 152 is extended to the boundary between the oxide films 74-1 and 74-2 which are located on the respective outer peripheral portions of the N+ semiconductor regions 71.

A cross-sectional view taken along line X-X' in B in FIG. 15 is similar to that of the sixth configuration example depicted in B in FIG. 13, for example.

In FIG. 15, C is a plan view of the pixel 51 according to the tenth configuration example.

A method of sectioning the tap peripheral region 151 and the pixel transistor neighboring region 152 in the tenth configuration example is similar to that in the ninth configuration example in B in FIG. 15. The tenth configuration example is different from the ninth configuration example in the oxide film pattern formed in the pixel transistor neighboring region 152.

Specifically, in the pixel transistor neighboring region 152 according to the tenth configuration example, the oxide films 171 are formed into a random pattern in which a plurality of the oxide films 171 each having an island shape are randomly arranged. Since the island-shaped oxide films 171 are randomly arranged, stress does not concentrate in any direction. Accordingly, the stress can be alleviated. It is to be noted that C in FIG. 15 depicts an example in which the shape of each oxide film 171 is a square, but the shape is not necessarily required to be a square. The shape may be any other defined shape such as a rectangle or a circle.

A cross-sectional view taken along line X-X' in C in FIG. 15 is similar to that of the sixth configuration example depicted in B in FIG. 13, for example.

In the sixth to tenth configuration examples depicted in FIGS. 13 to 15, no limitation is imposed on the shape, the number, and the arrangement of an oxide film or a space formed in the pixel transistor neighboring region 152, and any design can be adopted.

Also in the sixth to tenth configuration examples, since the oxide films 161, 171, or 181 are formed in the tap peripheral region 151 and the pixel transistor neighboring region 152, leakage current which has been explained with reference to A and B in FIG. 5 can be reduced to decrease current consumption. In addition, incident light passing through the semiconductor substrate 61 is absorbed by the oxide films 161, 171, or 181, so that the parasitic light sensitivity can be reduced. Further, the oxide films 161, 171, or 181 are covered with the P+ semiconductor region 143 or the P semiconductor region 144, so that occurrence of dark current can be inhibited.

Furthermore, the oxide films are formed in the semiconductor substrate 61 by an STI process. In this case, at a step for digging grooves for embedding the oxide films, the oxide films are formed in regions thinner than such a wide region as that of the oxide film 141 according to the first configuration example. Thus, the STI process stability can be enhanced. Accordingly, the oxide films 161, 171, and 181 can be formed with precision.

<10. Other Modifications>

In the abovementioned examples, the plan shapes of the N+ semiconductor region 71 and the P+ semiconductor region 72 constituting the tap (signal extraction section 65) are each formed into a circular shape (doughnut-like shape). However, the plan shape of the tap is not limited to a circular shape. For example, a shape depicted in A or B in FIG. 16 may be adopted.

Figure 16:
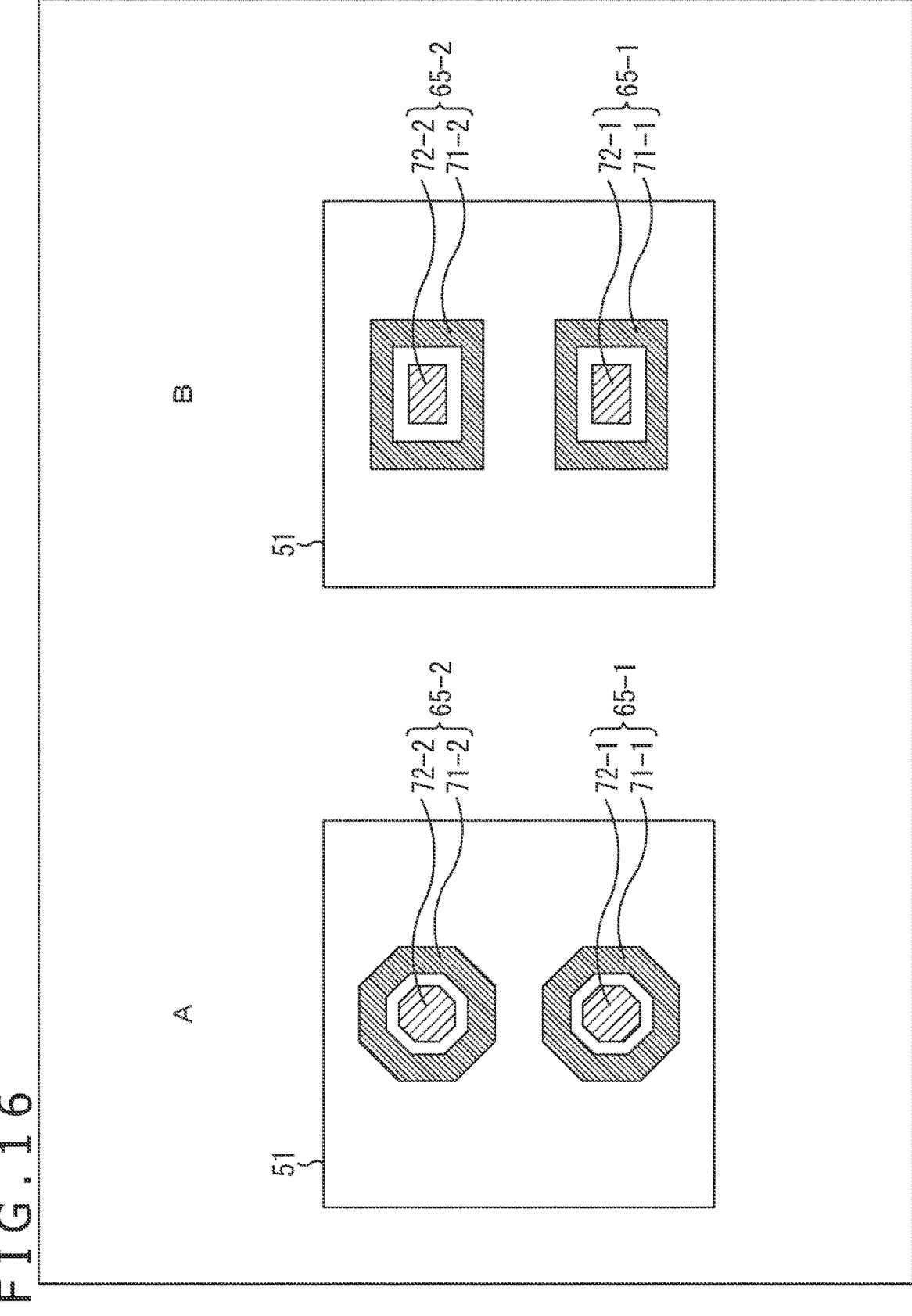
FIG. 16 depicts diagrams depicting modifications of a tap shape.

In FIG. 16, A depicts an example in which the respective plan shapes of the N+ semiconductor region 71 and the P+ semiconductor region 72 constituting a tap are each formed into an octagonal shape.

In FIG. 16, B depicts an example in which the respective plan shapes of the N+ semiconductor region 71 and the P+ semiconductor region 72 constituting a tap are each formed into a rectangular shape.

Any shape other than an octagonal or rectangular shape can, of course, be used as the plan shapes of the N+ semiconductor region 71 and the P+ semiconductor region 72 constituting a tap.

It is to be noted that A and B in FIG. 16 each depict only the N+ semiconductor regions 71 and the P+ semiconductor regions 72 of the two taps (signal extraction sections 65-1 and 65-2), for simplification. However, the pattern arrangement of the other components is similar to that in the abovementioned configuration examples.

Moreover, in the abovementioned examples, the two signal extraction sections 65 are provided in each pixel 51. However, three or more signal extraction sections 65 may be provided in each pixel.

Figure 17:
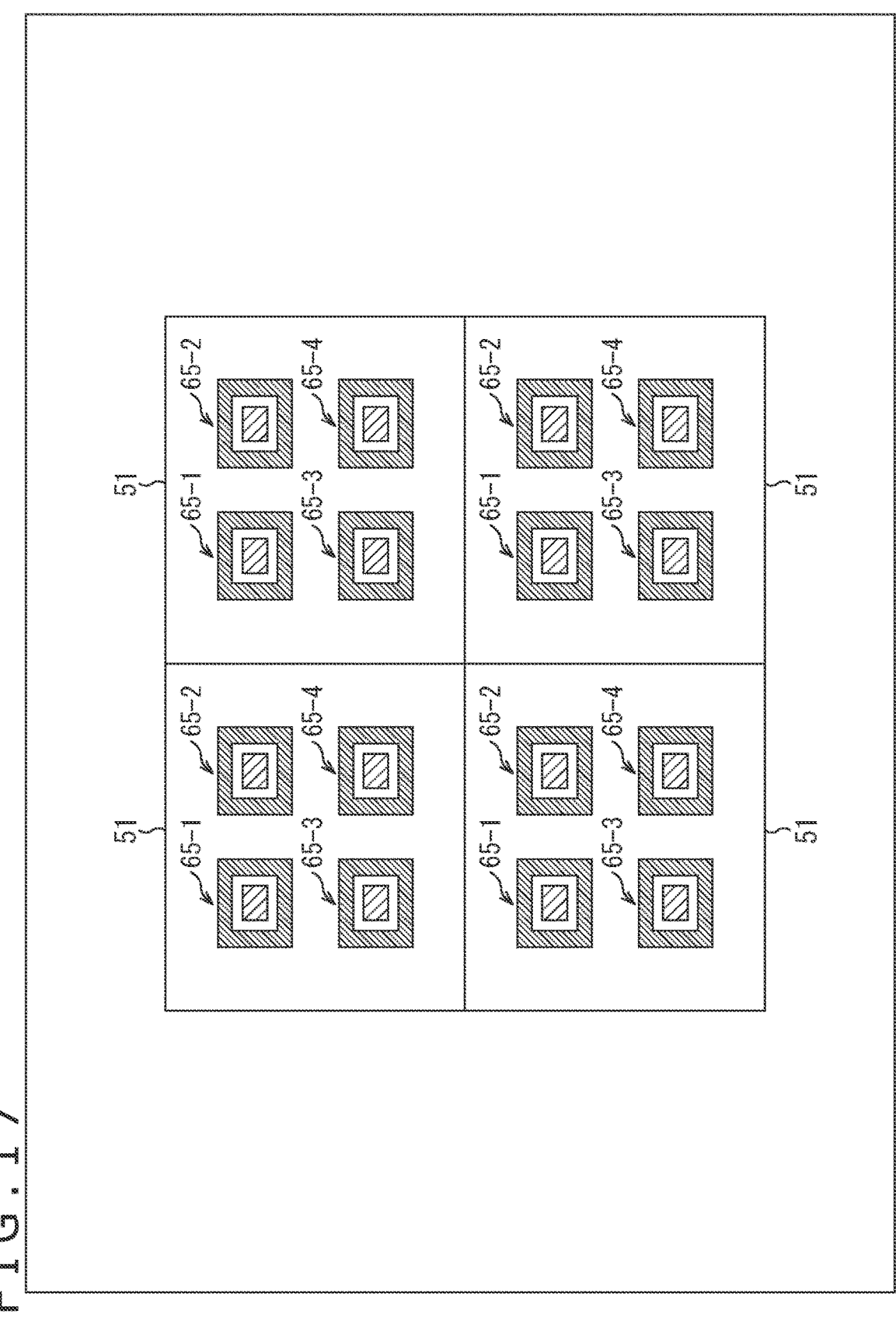
FIG. 17 is a diagram depicting a modification of a tap shape.

For example, FIG. 17 depicts a plan view of a pixel configuration example in which four signal extraction sections 65-1 to 65-4 are provided in each pixel 51.

In FIG. 17 in which some reference signs are omitted, each of the four signal extraction sections 65-1 to 65-4 is similar to the abovementioned signal extraction section 65, and thus includes the P+ semiconductor region 72 serving as a voltage application section and the N+ semiconductor region 71 serving as a charge detection section and being disposed to surround the N+ semiconductor region 71. Also in the pixel configuration in which three or more signal extraction sections 65 are provided in each pixel, oxide films that are equivalent to the oxide films 141, 161, 171 or the like and P-type semiconductor regions that are equivalent to the P+ semiconductor region 143, the P semiconductor region 144, and the like are provided in the tap peripheral region 151 and the pixel transistor neighboring region 152, as in the abovementioned configuration examples of the pixel 51.

In each of the abovementioned configuration examples of the pixel 51, a flat region in the pixel 51, except the two signal extraction sections 65 and the P-well region 76 in the pixel transistor region 77, is sectioned into two regions: the tap peripheral region 151 and the pixel transistor neighboring region 152, the tap peripheral region 151 and the pixel transistor neighboring region 152 have different oxide film patterns, and the respective P-type semiconductor regions thereof have different impurity concentrations.

However, a flat region in the pixel 51, except the two signal extraction sections 65 and the P-well region 76 in the pixel transistor region 77, may be sectioned into three or more regions, the three or more regions may have different oxide film patterns, and the respective P-type semiconductor regions thereof may have different impurity concentrations.

<11. Configuration Example of Ranging Module>

Figure 18:
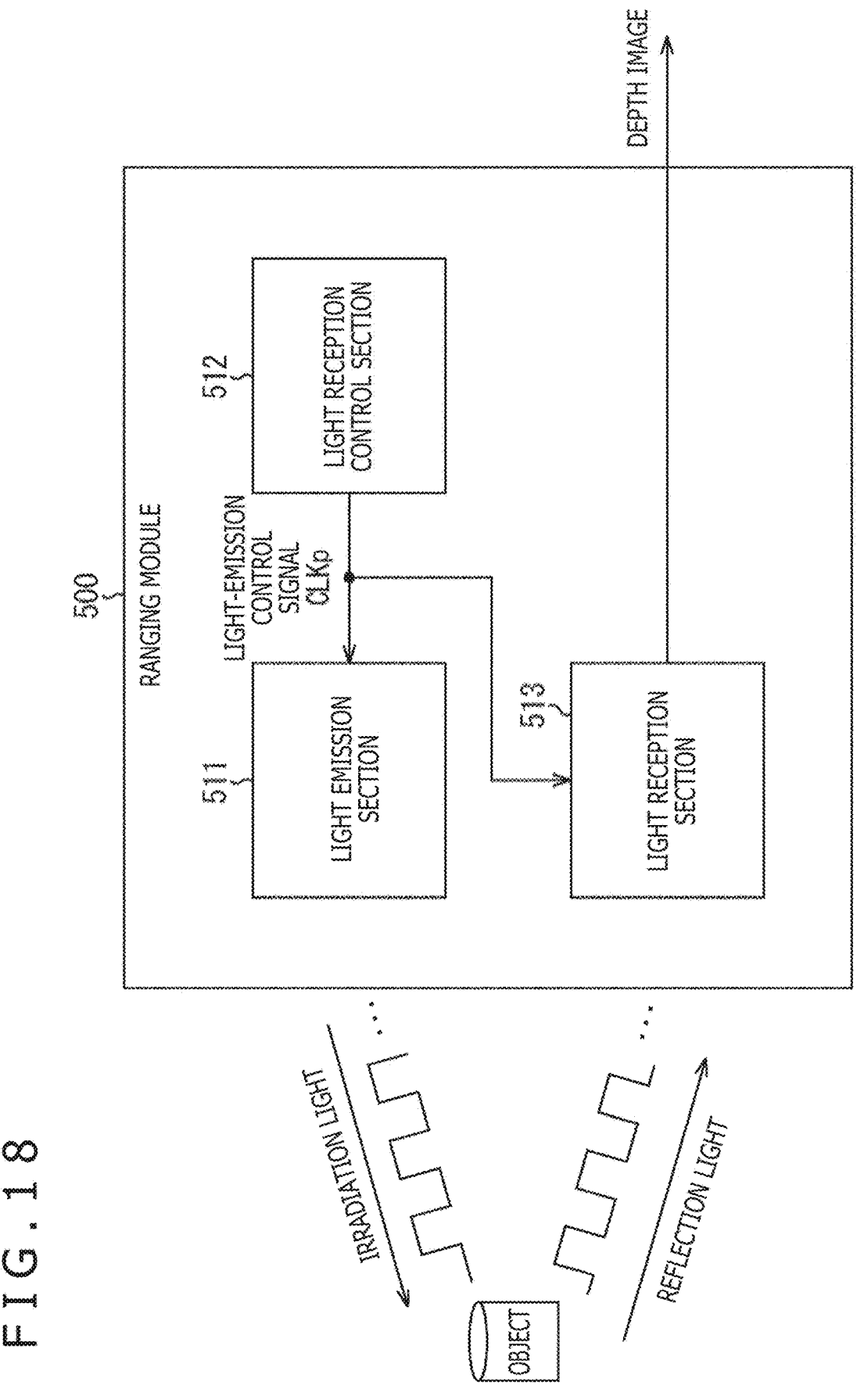
FIG. 18 is a block diagram depicting a configuration example of a ranging module to which the present technology is applied.

FIG. 18 is a block diagram depicting a configuration example of a ranging module that outputs ranging information by using the abovementioned light reception element 1.

A ranging module 500 includes a light emission section 511, a light emission control section 512, and a light reception section 513.

The light emission section 511 has a light source to emit light of a predetermined wavelength, and irradiates an object by emitting irradiation light the lightness of which periodically changes. For example, the light emission section 511 has, as the light source, a light emitting diode to emit infrared light of a wavelength ranging from 780 to 1000 nm, and emits the irradiation light in synchronization with a light-emission control signal CLKp of a rectangular wave supplied from the light emission control section 512.

It is to be noted that the light-emission control signal CLKp is not limited to any rectangular wave as long as the signal CLKp is a periodic signal. For example, a sine wave may be used as the light-emission control signal CLKp.

The light emission control section 512 controls an irradiation timing for the irradiation light by supplying the light-emission control signal CLKp to the light emission section 511 and the light reception section 513. The frequency of the light-emission control signal CLKp is 20 megahertz (MHz), for example. It is to be noted that the frequency of the light-emission control signal CLKp is not limited to 20 megahertz (MHz), and may be set to 5 megahertz (MHz), for example.

The light reception section 513 receives reflection light reflected by the object, calculates distance information for each pixel according to the light reception result, and generates and outputs a depth image in which a depth value corresponding to the distance to the object (subject) is stored as a pixel value.

The abovementioned light reception element 1 is used as the light reception section 513. The light reception element 1 serving as the light reception section 513 calculates, on the basis of the light-emission control signal CLKp, for example, distance information for each pixel from signal intensities detected by the respective charge detection sections (N+ semiconductor regions 71) of the signal extraction sections 65-1 and 65-2 in each pixel PX in the pixel array section 11.

In the abovementioned manner, the light reception element 1 can be incorporated as the light reception section 513 of the ranging module 500 that obtains and outputs information regarding the distance to a subject by indirect ToF. Consequently, the ranging performance of the ranging module 500 can be improved.

<12. Configuration Example of Electronic Apparatus>

The light reception element 1 is applicable to a ranging module, as previously explained, and further, is applicable to various electronic apparatuses including imaging apparatuses such as a digital still camera and a digital video camera having ranging functions and smartphones having ranging functions, for example.

Figure 19:
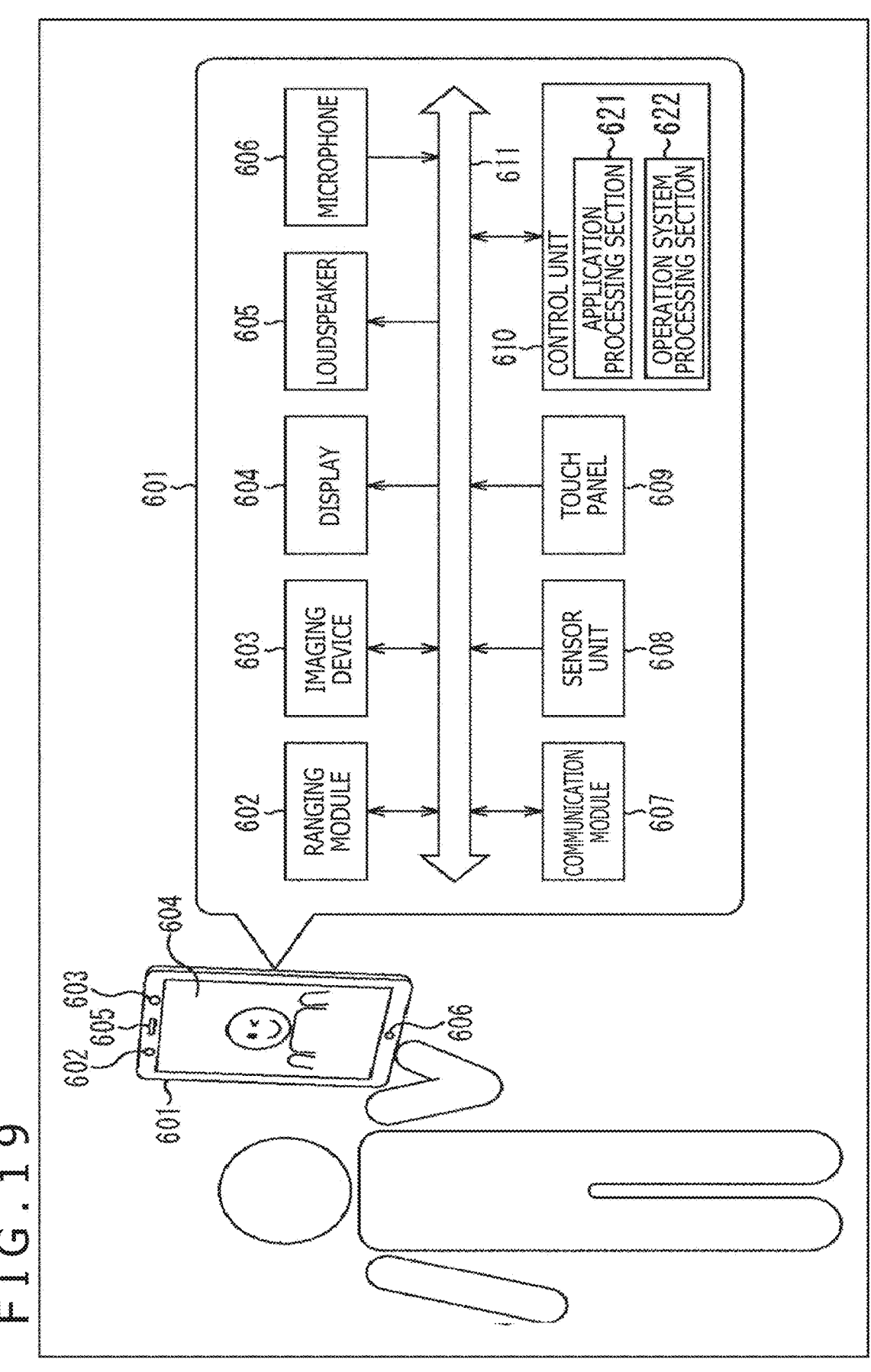
FIG. 19 is a block diagram depicting a configuration example of a smartphone which is an electronic apparatus to which the present technology is applied.

FIG. 19 is a block diagram depicting a configuration example of a smartphone that is an electronic apparatus to which the present technology is applied.

As depicted in FIG. 19, a smartphone 601 includes a ranging module 602, an imaging device 603, a display 604, a loudspeaker 605, a microphone 606, a communication module 607, a sensor unit 608, a touch panel 609, and a control unit 610 that are connected via a bus 611. In addition, the control unit 610 has functions of an application processing section 621 and an operation system processing section 622 by a CPU executing a program.

The ranging module 500 in FIG. 18 is adopted as the ranging module 602. For example, the ranging module 602 is disposed on the front surface of the smartphone 601, and performs ranging for a user of the smartphone 601. Accordingly, a depth value regarding the surface shape of the face, a hand, a finger, etc., of the user can be outputted as a ranging result.

The imaging device 603 is disposed on the front surface of the smartphone 601, and acquires an image of the user of the smartphone 601 by performing image capturing of the user as a subject. It is to be noted that, though not depicted, the imaging device 603 may be additionally disposed on the rear surface of the smartphone 601.

The display 604 displays an operation screen for causing the application processing section 621 and the operation system processing section 622 to perform processes, and displays an image captured by the imaging device 603. The loudspeaker 605 and the microphone 606 output a voice of a communication partner and collect a voice of the user during a telephone conversation using the smartphone 601, for example.

The communication module 607 carries out network communication over a communication network such as the internet, a public telephone line network, a wide-area communication network for wireless mobile bodies such as what is generally called the 4G or 5G network, a WAN (Wide Area Network), or a LAN (Local Area Network), and carries out short-distance wireless communication such as the Bluetooth (registered trademark) or NFC (Near Field Communication). The sensor unit 608 senses speed, acceleration, proximity, etc. The touch panel 609 acquires a user's touch operation performed on the operation screen being displayed on the display 604.

The application processing section 621 performs processing for providing various services through the smartphone 601. For example, the application processing section 621 can create a face by computer graphics to virtually reproduce user's facial expressions on the basis of a depth value supplied from the ranging module 602, and displays the face on the display 604. In addition, the application processing section 621 can create data regarding the three-dimensional shape of any three-dimensional object, for example, on the basis of a depth value supplied from the ranging module 602.

The operation system processing section 622 performs processing for implementing basic function and operation of the smartphone 601. For example, the operation system processing section 622 can authenticate a user face on the basis of a depth value supplied from the ranging module 602, and unlock the smartphone 601. In addition, the operation system processing section 622 can recognize a user gesture, for example, on the basis of a depth value supplied from the ranging module 602, and input various operations according to the recognized gesture.

The thus configured smartphone 601 uses the abovementioned ranging module 500 as the ranging module 602. As a result, the distance to a predetermined object can be measured and displayed, or data regarding the three-dimensional shape of a predetermined object can be created and displayed, for example.

<13. Examples of Application to Mobile Body>

The technology according to the present disclosure (present technology) is applicable to various products. For example, the technology according to the present disclosure may be realized as a device to be mounted on any type of a mobile body such as an automobile, an electric automobile, a hybrid electric automobile, a motorcycle, a bicycle, a personal mobility, an aircraft, a drone, a ship, or a robot.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of a vehicle control system to which the technology according to the present disclosure can be applied has been explained above. The technology according to the present disclosure can be applied to the outside-vehicle information detecting unit 12030 or the imaging section 12031 among the abovementioned components. Specifically, the light reception element 1 or the ranging module 500 can be applied to a distance detecting process block of the outside-vehicle information detecting unit 12030 or the imaging section 12031. When the technology according to the present disclosure is applied to the outside-vehicle information detecting unit 12030 or the imaging section 12031, the distance to an object such as a person, a vehicle, an obstruct, a sign, or a character on a road surface can be measured with high precision. The obtained distance information can be used to lessen the fatigue of a driver or increase the safety of a driver or a vehicle.

The embodiments of the present technology are not limited to those explained above, and various modifications can be made within the scope of the gist of the present technology.

Further, in the abovementioned light reception element 1, an electron is used as a signal carrier. However, a hole generated by photoelectric conversion may be used as a signal carrier. In such a case, it is sufficient that a charge detection section for detecting signal carriers includes a P+ semiconductor region, and that a voltage application section for generating an electric field in a substrate includes an N+ semiconductor region, so that the charge detection section provided in a signal extraction section can detect a hole as a signal carrier.

For the abovementioned light reception element 1, an embodiment obtained by combining all or a portion of the configuration examples can be adopted, for example.

It is to be noted that the effects described in the present description are just examples, and thus, are not limitative. Any effect other than those described herein may also be provided.

It is to be noted that the present technology may also have the following configurations.

(1)

A light reception element including:

a pixel array section having pixels two-dimensionally arranged in a matrix form, the pixels each including two taps that are a first tap that detects an electric charge obtained through photoelectric conversion by a photoelectric conversion section and a second tap that detects an electric charge obtained through photoelectric conversion by the photoelectric conversion section, in which a flat region in each pixel, except the two taps and a pixel transistor region, includes a tap peripheral region that is an outer peripheral portion of the taps and a pixel transistor neighboring region that is near the pixel transistor region, in the tap peripheral region, an embedded oxide film is formed on a surface opposite to a light incident surface of a substrate, and a first semiconductor region having a same conductive type as the substrate and having an impurity concentration higher than a substrate concentration is formed on the light incident surface side of the embedded oxide film, and in the pixel transistor neighboring region, a second semiconductor region having the same conductive type as the substrate and having an impurity concentration higher than the substrate concentration is formed.

(2)

The light reception element according to (1), in which the embedded oxide film is also formed in the pixel transistor neighboring region, and the second semiconductor region is formed on the light incident surface side of the embedded oxide film.

(3)

The light reception element according to (1) or (2), in which the tap peripheral region and the pixel transistor neighboring region are sectioned along a direction that is orthogonal to an arrangement direction of the two taps in the pixel.

(4)

The light reception element according to (2) or (3), in which the embedded oxide film in the tap peripheral region is formed all over the tap peripheral region, and the embedded oxide film in the pixel transistor neighboring region is formed into a stripe pattern.

(5)

The light reception element according to (4), in which the stripe pattern in the pixel transistor neighboring region is along a column direction.

(6)

The light reception element according to (4), in which the stripe pattern in the pixel transistor neighboring region is along a row direction.

(7)

The light reception element according to (2) or (3), in which the embedded oxide film in the tap peripheral region is formed all over the tap peripheral region, and the embedded oxide films in the pixel transistor neighboring region are formed into an array pattern in which two or more oxide films each having a rectangular shape are regularly arranged in each of a column direction and a row direction.

(8)

The light reception element according to (2) or (3), in which the embedded oxide film in the tap peripheral region is formed all over the tap peripheral region, and the embedded oxide film in the pixel transistor neighboring region is formed into a lattice-like pattern in which two or more spaces each having a rectangular shape are regularly arranged in each of a column direction and a row direction.

(9)

The light reception element according to (2), in which, in the flat region in the pixel, except the two taps and the pixel transistor region, a region that is located on outer peripheral portions of the two taps is the tap peripheral region, and any region other than the tap peripheral region is the pixel transistor neighboring region.

(10)

The light reception element according to (9), in which the embedded oxide film in the pixel transistor neighboring region is formed into a stripe pattern.

(11)

The light reception element according to (9), in which the stripe pattern in the pixel transistor neighboring region is along a column direction.

(12)

The light reception element according to (9), in which the stripe pattern in the pixel transistor neighboring region is along a row direction.

(13)

The light reception element according to (9), in which the embedded oxide films in the pixel transistor neighboring region are formed into an array pattern in which two or more oxide films each having a rectangular shape are regularly arranged in each of a column direction and a row direction.

(14)

The light reception element according to (9), in which the embedded oxide film in the pixel transistor neighboring region is formed into a lattice-like pattern in which two or more spaces each having a rectangular shape are regularly arranged in each of a column direction and a row direction.

(15)

The light reception element according to (9), in which the embedded oxide films in the pixel transistor neighboring region are formed into a random pattern in which a plurality of island-shaped oxide films are randomly arranged.

(16)

The light reception element according to any one of (1) to (15), in which the embedded oxide film in the pixel transistor neighboring region is formed deeper than the embedded oxide film in the tap peripheral region.

(17)

The light reception element according to any one of (1) to (15), in which the embedded oxide film in the pixel transistor neighboring region is formed shallower than the embedded oxide film in the tap peripheral region.

(18)

An electronic apparatus provided with a light reception element, the light reception element including a pixel array section having pixels two-dimensionally arranged in a matrix form, the pixels each including two taps that are a first tap that detects an electric charge obtained through photoelectric conversion by a photoelectric conversion section and a second tap that detects an electric charge obtained through photoelectric conversion by the photoelectric conversion section, in which a flat region in each pixel, except the two taps and a pixel transistor region, includes a tap peripheral region that is an outer peripheral portion of the taps and a pixel transistor neighboring region that is near the pixel transistor region, in the tap peripheral region, an embedded oxide film is formed on a surface opposite to a light incident surface of a substrate, and a first semiconductor region having a same conductive type as the substrate and having an impurity concentration higher than a substrate concentration is formed on the light incident surface side of the embedded oxide film, and in the pixel transistor neighboring region, a second semiconductor region having the same conductive type as the substrate and having an impurity concentration higher than the substrate concentration is formed.

REFERENCE SIGNS LIST

1: Light reception element
20: Pixel array section

21: Tap driving section
51: Pixel
61: Semiconductor substrate
TA: First tap
TB: Second tap
65-1, 65-2: Signal extraction section
71-1, 71-2: N+ semiconductor region
72-1, 72-2: P+ semiconductor region
73-1, 73-2: Oxide film
74-1, 74-2: Oxide film
75, 76: P-well region
77: Pixel transistor region
142: P-well region
141: Oxide film (embedded oxide film)
143: P+ semiconductor region
144: P semiconductor region
145: Oxide film
151: Tap peripheral region
152: Pixel transistor neighboring region
161, 171, 181: Oxide film
181: Space
500: Ranging module
601: Smartphone
602: Ranging module

What is claimed is:

1. A light reception element comprising:

a pixel array section having pixels two-dimensionally arranged in a matrix form, each pixel including a first tap that detects a first electric charge obtained through photoelectric conversion by a photoelectric conversion section and a second tap that detects a second electric charge obtained through photoelectric conversion by the photoelectric conversion section, wherein in a tap peripheral region, an embedded oxide film is formed on a surface opposite to a light incident surface of a substrate, and a first semiconductor region having a same conductive type as the substrate and having a first impurity concentration higher than an impurity concentration of the substrate is disposed above the embedded oxide film in a cross-sectional view, wherein in a pixel transistor neighboring region, a second semiconductor region having the same conductive type as the substrate and having a second impurity concentration higher than the impurity concentration of the substrate and higher than the first impurity concentration is disposed above the embedded oxide film in the cross-sectional view, and wherein the tap peripheral region is adjacent to the pixel transistor neighboring region in the cross-sectional view.

2. The light reception element according to claim 1, wherein the tap peripheral region and the pixel transistor neighboring region are sectioned along a direction that is orthogonal to an arrangement direction of the first tap and the second tap in the pixel.

3. The light reception element according to claim 1, wherein the embedded oxide film in the tap peripheral region is formed all over the tap peripheral region, and the embedded oxide film in the pixel transistor neighboring region is formed into a stripe pattern.

4. The light reception element according to claim 3, wherein the stripe pattern in the pixel transistor neighboring region is along a column direction.

5. The light reception element according to claim 3, wherein the stripe pattern in the pixel transistor neighboring region is along a row direction.

6. The light reception element according to claim 1, wherein the embedded oxide film in the tap peripheral region is formed all over the tap peripheral region, and wherein the embedded oxide film in the pixel transistor neighboring region are formed into an array pattern in which two or more oxide films each having a rectangular shape are regularly arranged in each of a column direction and a row direction.

7. The light reception element according to claim 1, wherein the embedded oxide film in the tap peripheral region is formed all over the tap peripheral region, and wherein the embedded oxide film in the pixel transistor neighboring region is formed into a lattice-like pattern in which two or more spaces each having a rectangular shape are regularly arranged in each of a column direction and a row direction.

8. The light reception element according to claim 1, wherein, in a flat region in the pixel, except the first tap, the second tap, and the pixel transistor neighboring region, a region that is located on outer peripheral portions of the first tap and the second tap is the tap peripheral region, and any region other than the tap peripheral region is the pixel transistor neighboring region.

9. The light reception element according to claim 8, wherein the embedded oxide film in the pixel transistor neighboring region is formed into a stripe pattern.

10. The light reception element according to claim 9, wherein the stripe pattern in the pixel transistor neighboring region is along a column direction.

11. The light reception element according to claim 9, wherein the stripe pattern in the pixel transistor neighboring region is along a row direction.

12. The light reception element according to claim 8, wherein the embedded oxide film in the pixel transistor neighboring region are formed into an array pattern in which two or more oxide films each having a rectangular shape are regularly arranged in each of a column direction and a row direction.

13. The light reception element according to claim 8, wherein the embedded oxide film in the pixel transistor neighboring region is formed into a lattice-like pattern in which two or more spaces each having a rectangular shape are regularly arranged in each of a column direction and a row direction.

14. The light reception element according to claim 8, wherein the embedded oxide film in the pixel transistor neighboring region are formed into a random pattern in which a plurality of island-shaped oxide films are randomly arranged.

15. The light reception element according to claim 14, wherein the embedded oxide film in the pixel transistor neighboring region is formed deeper than the embedded oxide film in the tap peripheral region.

16. The light reception element according to claim 14, wherein the embedded oxide film in the pixel transistor neighboring region is formed shallower than the embedded oxide film in the tap peripheral region.

17. An electronic apparatus provided with a light reception element, the light reception element including:

a pixel array section having pixels two-dimensionally arranged in a matrix form, each pixel including a first tap that detects a first electric charge obtained through photoelectric conversion by a photoelectric conversion section and a second tap that detects a second electric charge obtained through photoelectric conversion by the photoelectric conversion section, wherein in a tap peripheral region, an embedded oxide film is formed on a surface opposite to a light incident surface of a substrate, and a first semiconductor region having a same conductive type as the substrate and having a first impurity concentration higher than an impurity concentration of the substrate is disposed above the embedded oxide film in a cross-sectional view, wherein in a pixel transistor neighboring region, a second semiconductor region having the same conductive type as the substrate and having a second impurity concentration higher than the impurity concentration of the substrate and lower than the first impurity concentration is disposed above the embedded oxide film in the cross-sectional view, and wherein the tap peripheral region is adjacent to the pixel transistor neighboring region in the cross-sectional view.

* * * * *